US012689340B2

(12) United States Patent
Singh et al.

(10) Patent No.: US 12,689,340 B2
(45) Date of Patent: Jul. 21, 2026

(54) LINEAR AND BANDWIDTH RECONFIGURABLE CURRENT BUFFER OR AMPLIFIER

(71) Applicant: QUALCOMM Incorporated, San Diego, CA (US)

(72) Inventors: Rahul Singh, San Diego, CA (US); Mehran Bakhshiani, San Diego, CA (US); Timothy Donald Gathman, San Diego, CA (US); Yuhua Guo, San Diego, CA (US); Elias Dagher, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 917 days.

(21) Appl. No.: 17/886,887

(22) Filed: Aug. 12, 2022

(65) Prior Publication Data
US 2024/0056043 A1      Feb. 15, 2024

(51) Int. Cl.
| | |
|---|---|
| *H03F 3/45* | (2006.01) |
| *H03F 1/14* | (2006.01) |
| *H03H 11/04* | (2006.01) |
| *H03M 1/12* | (2006.01) |
(Continued)

(52) U.S. Cl.
CPC ........... *H03F 3/45273* (2013.01); *H03F 1/14* (2013.01); *H03H 11/04* (2013.01); *H03M 1/12* (2013.01); *H04B 1/04* (2013.01); *H04B 1/10* (2013.01)

(58) Field of Classification Search
CPC ........ H03F 3/45273; H03F 1/14; H03F 1/301; H03F 2200/453; H03F 2203/45134; H03F 2203/45651; H03F 1/42; H03F 2203/45318; H03F 2203/45514; H03F 2200/91; H03F 2203/45306; H03F 3/303; H03F 3/3064;
(Continued)

(56) References Cited

U.S. PATENT DOCUMENTS

| | | | | |
|---|---|---|---|---|
| 6,326,846 B1 * | 12/2001 | Brandt | ................ | H03F 3/45183 330/261 |
| 6,621,334 B2 * | 9/2003 | Ausserlechner | .......... | H03F 3/38 330/10 |

(Continued)

OTHER PUBLICATIONS

Kawahito S., et al., "CMOS Class-AB Current Mirrors for Precision Current-Mode Analog-Signal-Processing Elements", IEEE Transactions on Circuits and Systems—II: Analog and Digital Signal Processing, vol. 43, No. 12, Dec. 1996, pp. 843-845.
Kim Y., et al., "An RF Receiver for Multi-Band Inter- and Intra-Band Carrier Aggregation", IEEE Radio Frequency Integrated Circuits Symposium (RFIC), 2016, pp. 79-82.
(Continued)

*Primary Examiner* — Andrea Lindgren Baltzell
*Assistant Examiner* — Khiem D Nguyen
(74) *Attorney, Agent, or Firm* — Loza & Loza LLP

(57) ABSTRACT

An apparatus, including a positive input for an input differential signal; a negative input for the input differential signal; a positive output for an output differential signal; a negative output for the output differential signal; a first capacitor including a first terminal coupled to the positive output; a second capacitor including a first terminal coupled to the negative output; and a switching network configured to: couple a second terminal of the first capacitor to the negative input or a positive node based on a mode signal; and couple a second terminal of the second capacitor to the positive input or a negative node based on the mode signal.

22 Claims, 7 Drawing Sheets

(51) Int. Cl.
   *H04B 1/04*     (2006.01)
   *H04B 1/10*     (2006.01)
(58) Field of Classification Search
   CPC ...... H03F 3/45179; H03H 11/04; H03M 1/12;
                H04B 1/04; H04B 1/10; G05F 3/262
   USPC .......................................... 330/51, 253, 257
   See application file for complete search history.

(56)                References Cited

U.S. PATENT DOCUMENTS

| | | | |
|---|---|---|---|
| 8,368,430 B2 * | 2/2013 | Watanabe ............ | G11C 27/026 |
| | | | 327/91 |
| 10,153,934 B1 | 12/2018 | Gathman et al. | |
| 2004/0227477 A1 | 11/2004 | Otani et al. | |
| 2005/0083130 A1 | 4/2005 | Grilo | |
| 2016/0187207 A1 | 6/2016 | Li | |

OTHER PUBLICATIONS

Wang Z., "Wideband Class AB (Push-Pull) Current Amplifier in CMOS Technology", Electron Letters, vol. 26, Apr. 12, 1990, pp. 543-545.
Fan Q., et al., "A 1.8 μ W 60 nV/√Hz Capacitively-Coupled Chopper Instrumentation Amplifier in 65 nm CMOS for Wireless Sensor Nodes", IEEE Journal of Solid-state Circuits, IEEE, USA, vol. 46, No. 7, Jun. 24, 2011, pp. 1534-1543, XP011356578, p. 1534, Left-hand Column, Line 18—p. 1541, Right-Hand Column, Line 4, Figures 1-16.
Partial International Search Report—PCT/US2023/070352—ISA/EPO—Nov. 7, 2023.
Tseng Y., et al., "A 0.09 μ W Low Power Front-End Biopotential Amplifier for Biosignal Recording", IEEE Transactions on Biomedical Circuits and Systems, IEEE, US, vol. 6, No. 5, Nov. 28, 2012, pp. 508-516, XP011481644, p. 508, Left-Hand Column, Line 14—p. 515, Left-Hand Column, Line 20, Figures 1-22.
International Search Report and Written Opinion—PCT/US2023/070352—ISA/EPO—Feb. 15, 2024.

* cited by examiner

300

400

| High BW Mode | Low BW Mode | Bandwidth (MHz) | C (pF) |
|---|---|---|---|
| 0 | 1 | 100 | 1.65 |
| 0 | 1 | 200 | 0.55 |
| 0 | 1 | 400 | 0.15 |
| 1 | 0 | 600 | 0 |
| 1 | 0 | 800 | 0.35 |

LEGEND:
——————   M=+5.75dB
············   M=+3.5dB
- - - - - -   M=0dB
— — — —   M=-2.5dB
—·—·—·   M=-6dB
—··—··   M=-10dB

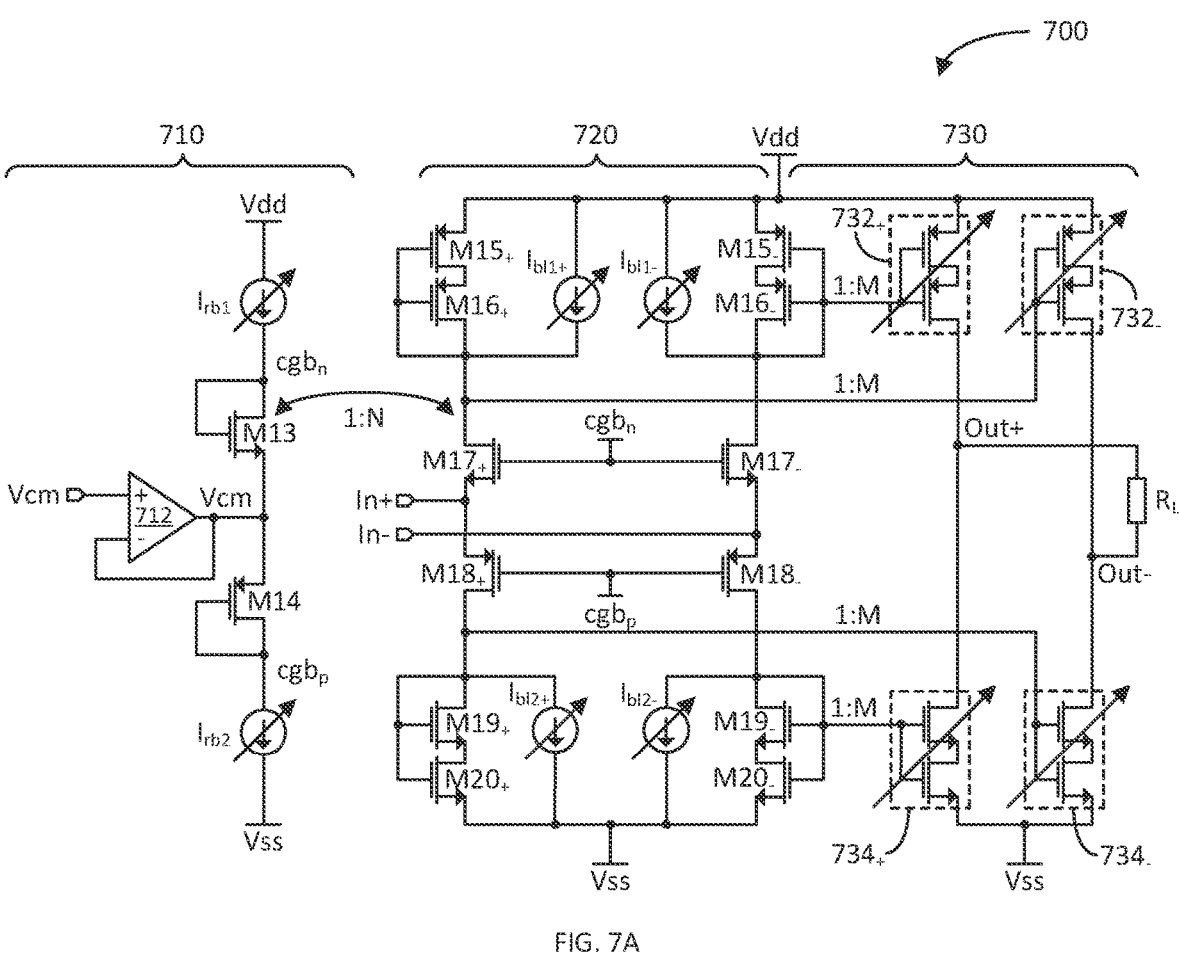
FIG. 7A
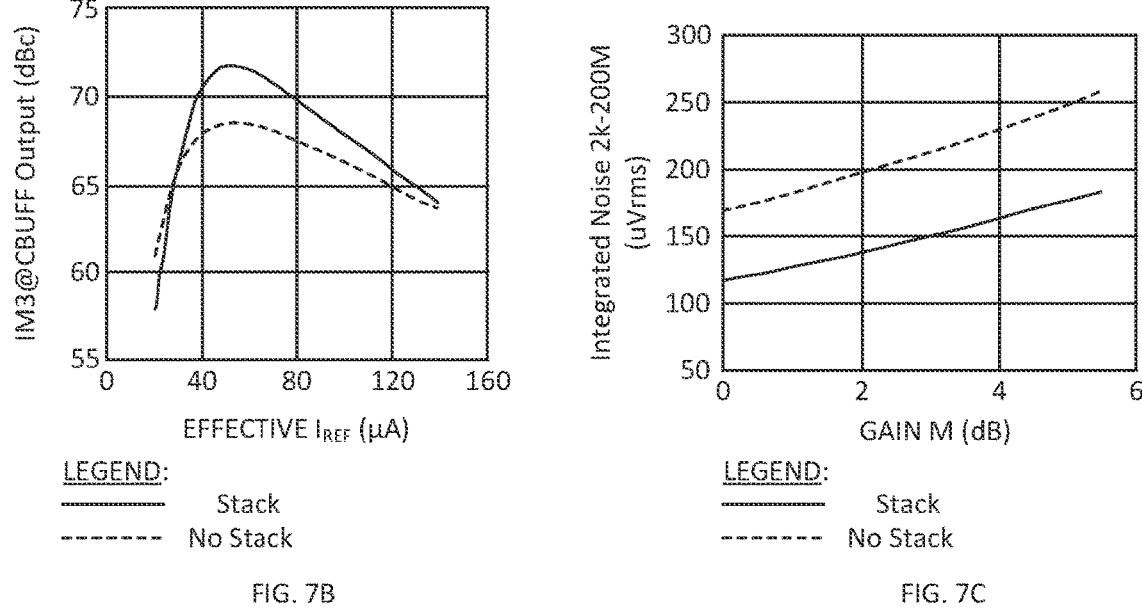
FIG. 7B
FIG. 7C

LINEAR AND BANDWIDTH RECONFIGURABLE CURRENT BUFFER OR AMPLIFIER

FIELD

Aspects of the present disclosure relate generally to radio frequency (RF) and baseband (BB) circuits, and in particular, to a linear and bandwidth reconfigurable current buffer or amplifier, which may be used as an interface between a mixer and an analog-to-digital converter (ADC) in receivers.

BACKGROUND

A mixer is often employed in a receiver to frequency downconvert a radio frequency (RF) signal into an intermediate signal (IF) or a baseband (BB) signal. In certain applications, an analog-to-digital converter (ADC) is coupled to an output of the mixer. If the mixer is implemented as a current-mode mixer, interfacing an ADC to the output of the current-mode mixer may result in certain issues due to a relatively high input impedance of the ADC. For example, this may adversely impact the linearity of the receiver. Accordingly, it may be desirable to put an interface circuit between the mixer and the ADC to address the aforementioned issues.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a positive input for an input differential signal; a negative input for the input differential signal; a positive output for an output differential signal; a negative output for the output differential signal; a first capacitor including a first terminal coupled to the positive output; a second capacitor including a first terminal coupled to the negative output; and a switching network configured to: couple a second terminal of the first capacitor to the negative input or a positive node based on a mode signal; and couple a second terminal of the second capacitor to the positive input or a negative node based on the mode signal.

Another aspect of the disclosure relates to a method. The method includes coupling capacitors to a differential amplifier to configure the capacitors as Miller capacitors or gate-drain neutralization capacitors based on a mode signal.

Another aspect of the disclosure relates to an apparatus. The apparatus includes a first input current mirror field effect transistor (FET); a first input FET coupled in series with the first input current mirror FET, wherein the first input FET includes a source configured to receive an input signal; a first variable current source coupled in parallel with the first input current mirror FET; a first output current mirror FET including a gate coupled to a gate/drain of the first input current mirror FET; and a control circuit configured to control an impedance at the source of the first input FET including adjusting a first current through the input current mirror FET and a second current generated by the first variable current source to control a third current through the first input FET.

Another aspect of the disclosure relates to a method. The method includes generating a first current through an input current mirror field effect transistor (FET); generating a second current through an output current mirror FET related to a current gain multiplied by the first current; generating a third current; and generating a fourth current through an input FET being related to a sum of the first and third currents.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 7A illustrates a schematic diagram of another example current buffer or amplifier in accordance with another aspect of the disclosure.

FIG. 7B illustrates a graph of an example linearity over effective reference current associated with the current buffer or amplifier of FIG. 7A in accordance with another aspect of the disclosure.

FIG. 7C illustrates a graph of an example noise versus gain response associated with the current buffer or amplifier of FIG. 7A in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
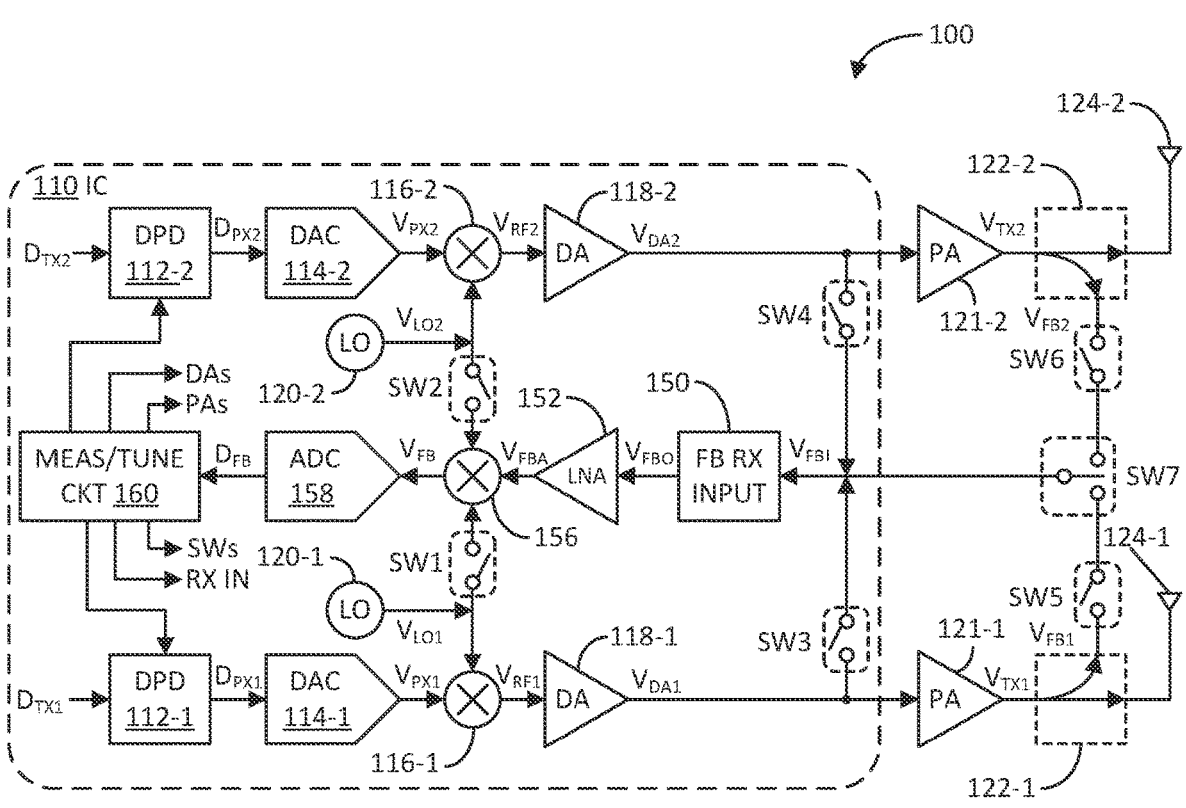
FIG. 1 illustrates a schematic diagram of an example transmitter system in accordance with an aspect of the disclosure.

FIG. 1 illustrates a block diagram of an example transmitter system 100 in accordance with an aspect of the disclosure. As discussed further herein, the transmitter system 100 may be configured to transmit signals in accordance with carrier aggregation, such as uplink carrier aggregation (ULCA). In carrier aggregation, a set of carriers may be used to transmit data simultaneously to one or more remote wireless devices. Further, the transmitter system 100 includes a feedback receiver to measure and tune a set of transmit chains used to transmit the data-modulated carriers in accordance with carrier aggregation.

In particular, the transmitter system 100 includes an integrated circuit (IC) 110, which may be implemented as a system on chip (SOC). In this example, the IC 110 includes a first transmit chain including a first digital predistortion (DPD) circuit 112-1, a first digital-to-analog converter (DAC) 114-1, a first local oscillator (LO) 120-1, a first frequency up converting mixer 116-1, and a first driver amplifier (DA) 118-1 (may also be referred to as a pre-amplifier). Similarly, the IC 110 includes a second transmit chain including a second DPD circuit 112-2, a second DAC 114-2, a second LO 120-2, a second frequency up converting mixer 116-2, and a second DA 118-2. Although, in this example, the IC 110 is shown as having two (2) transmit chains, it shall be understood that the IC 110 may include more than two (2) transmit chains.

In this example, the IC 110 includes a feedback receiver (FB RX) including an input stage 150, a low noise amplifier (LNA) 152, a frequency down converting mixer 156, an analog-to-digital converter (ADC) 158, a measurement/tuning circuit 160, and a first set of switching devices SW1-SW4. The measurement/tuning circuit 160 may be any processor-based circuit (e.g., microprocessor, microcontroller, field programmable gate array, etc.), which may include an associated memory with instructions, and/or part of a firmware, etc.

Further, in accordance with this example, the transmitter system 100 may further include components external to the IC 110, such as a first power amplifier (PA) 121-1, a first directional coupler 122-1, and a first antenna (or antenna array) 124-1 associated with the first transmit chain. Similarly, external to the IC 110, the transmitter system 100 may further include a second PA 121-2, a second directional coupler 122-2, and a second antenna (or antenna array) 124-2 associated with the second transmit chain. Additionally, external to the IC 110, the transmitter system 100 includes a second set of switching devices SW5 to SW7. It shall be understood that the division between what components lie within the IC 110 and what components lie external to the IC 110 may vary depending on design factors (and that certain components of the IC 110 may be split among different ICs—such as the DPD circuit 112-2 may be in a different IC than the mixer 116-2 etc.). It shall also be understood that the transmitter system 100 may be implemented with discrete components (in lieu of the IC 110) or entirely with integrated components within the IC 110.

With reference to the first transmit chain, a first digital data signal $D_{TX1}$ is provided to an input of the first DPD circuit 112-1. The first DPD circuit 112-1 applies predistortion to the first digital data signal $D_{TX1}$ based on control signals from the measurement/tuning circuit 160 to generate a first predistorted digital signal $D_{PX1}$. The first DAC 114-1 may receive the first predistorted digital signal $D_{PX1}$ directly or via one or more components, and convert the first predistorted digital signal $D_{PX1}$ into a first predistorted analog signal $V_{PX1}$. The first mixer 116-1 mixes the first predistorted analog signal $V_{PX1}$ with a first LO signal $V_{LO1}$ generated by the first LO 120-1 (upconverts the first pre-distorted analog signal $V_{PX1}$) to generate a first radio frequency (RF) signal $V_{RF1}$. It should be appreciated that in some systems the first mixer 116-1 mixes the first predistorted analog signal $V_{PX1}$ with a first LO signal $V_{LO1}$ generated by the first LO 120-1 (upconverts the first predistorted analog signal $V_{PX1}$) to generate a first intermediate frequency (IF) that may be then upconverted to an RF frequency at a later transmitter stage. It shall be understood that one or more filters may be associated with the first mixer 116-1 to substantially remove or suppress unwanted signal components from the first RF signal $V_{RF1}$.

The first DA 118-1 amplifies the first RF signal $V_{RF1}$ to generate a first pre-amplified signal $V_{DA1}$ based on control signals generated by the measurement/tuning circuit 160. The first PA 121-1 amplifies the first pre-amplified signal $V_{DA1}$ based on control signals generated by the measurement/tuning circuit 160 to generate a first transmit signal $V_{TX1}$. The first transmit signal $V_{TX1}$ is provided to the first antenna 124-1 via the first directional coupler 122-1 to radiate the first transmit signal $V_{TX1}$ into free space for wireless transmission to one or more remote devices. The first directional coupler 122-1, in turn, couples out a portion of the first transmit signal $V_{TX1}$ to generate a first feedback signal $V_{FB1}$ for measurement and tuning purposes, as discussed in more detail further herein.

With reference to the second transmit chain, a second digital data signal $D_{TX2}$ is provided to an input of the second DPD circuit 112-2. The second DPD circuit 112-2 applies predistortion to the second digital data signal $D_{TX2}$ based on control signals from the measurement/tuning circuit 160 to generate a second predistorted digital signal $D_{PX2}$. The second DAC 114-2 may receive the second predistorted digital signal $D_{PX2}$ directly or via one or more components, and convert the second predistorted digital signal $D_{PX2}$ into a second predistorted analog signal $V_{PX2}$. The second mixer 116-2 mixes the second predistorted analog signal $V_{PX2}$ with a second LO signal $V_{LO2}$ generated by the second LO 120-2 (upconverts the second predistorted analog signal $V_{PX2}$) to generate a second RF signal $V_{RF2}$. It shall be understood that one or more filters may be associated with the second mixer 116-2 to substantially remove or suppress unwanted signal components from the second RF signal $V_{RF2}$.

The second DA 118-2 amplifies the second RF signal $V_{RF2}$ to generate a second pre-amplified signal $V_{DA2}$ based on control signals generated by the measurement/tuning circuit 160. The second PA 121-2 amplifies the second pre-amplified signal $V_{DA2}$ based on control signals generated by the measurement/tuning circuit 160 to generate a second transmit signal $V_{TX2}$. The second transmit signal $V_{TX2}$ is provided to the second antenna 124-2 via the second directional coupler 122-2 to radiate the second transmit signal $V_{TX2}$ into free space for wireless transmission to one or more remote devices. The second directional coupler 122-2, in turn, couples out a portion of the second transmit signal $V_{TX2}$ to generate a second feedback signal $V_{FB2}$ for measurement and tuning purposes, as discussed in more detail further herein.

As discussed, the feedback receiver is for tuning the first and second transmit chains, including tuning the predistortion applied by the first and second DPD circuits 112-1 and 112-2, the gains of the first and second DAs 118-1 and 118-2, and the gains of the first and second PAs 121-1 and 121-2. For example, when the first transmit chain is to be tuned based on the first transmit signal $V_{TX1}$, the measurement/tuning circuit 160 sets the switching devices SW1 and SW5 in their closed states, and the switching devices SW2, SW3, SW4, and SW6 in their open states. Additionally, the measurement/tuning circuit 160 sets the switching device SW7, which may be implemented as a single pole double throw (SPDT) switch, such that it couples the switching device SW5 to the input of the FB RX input stage 150, and decouples the switching device SW6 from the input of the FB RX input stage 150.

In this configuration, the first feedback signal $V_{FB1}$ is provided to the input of the FB RX input stage 150 as input feedback signal $V_{FBI}$ via the switching devices SW5 and SW7. The FB RX input stage 150 provides a desired passband for the input feedback signal $V_{FBI}$, a desired impedance matching at the input of the LNA 152, programmable signal attenuation, and third harmonic rejection based on control signals generated by the measurement/tuning circuit 160. Accordingly, the FB RX input stage 150 produces an output feedback signal $V_{FBO}$ based on the input feedback signal $V_{FBI}$. The LNA 152 amplifies the output feedback signal $V_{FBO}$ to generate an amplified feedback signal $V_{FBA}$. The mixer 156 mixes the amplified feedback signal $V_{FBA}$ with the first LO signal $V_{LO1}$ received from the first LO 120-1 via the closed switching device SW1 (down converts the amplified feedback signal $V_{FBA}$) to generate a baseband feedback signal $V_{FB}$. The ADC 158 converts the baseband feedback signal $V_{FB}$ into a digital feedback signal $D_{FB}$. The measurement/tuning circuit 160 tunes the first transmit chain based on the digital feedback signal $D_{FB}$.

The measurement/tuning circuit 160 processes the digital feedback signal $D_{FB}$ to measure distortion present in the first transmit signal $V_{TX1}$, and controls/tunes the first DPD circuit 112-1 to apply predistortion to the first digital data signal $D_{TX1}$, so as to reduce the distortion in the first transmit signal $V_{TX1}$. The measurement/tuning circuit 160 also processes the digital feedback signal $D_{FB}$ to determine the power level of the first transmit signal $V_{TX1}$ to control/tune the gain of the first DA 118-1 and/or the first PA 121-1.

Alternatively, or in addition to, the first transmit chain may be tuned based on the first pre-amplified signal $V_{DA1}$. In this regard, the measurement/tuning circuit 160 sets the switching devices SW1 and SW3 in their closed states, and the switching devices SW2, SW4, SW5, and SW6 in their open states. As switching devices SW5 and SW6 are open, the measurement/tuning circuit 160 may set the switching device SW7 in any configuration, although setting it towards the first transmit chain may be better to reduce signal leakage from the second transmit chain into the FB RX input stage 150. In accordance with this measurement, the measurement/tuning circuit 160 processes the digital feedback signal $D_{FB}$ to determine the power level of the first pre-amplified signal $V_{DA1}$ to control/tune the gain of the first DA 118-1. The tuning of the second transmit chain may operate in a similar manner as the tuning of the first transmit chain, as discussed.

Desirable characteristics of the feedback mixer-ADC 156/158 interface may include wide baseband bandwidth (e.g., around 800 mega Hertz (MHz)), tunable baseband bandwidth (e.g., from 100 MHz to 800 MHz), high linearity (e.g., third-order intermodulation distortion (IM3) of 65 decibels relative to carrier (dBc) or better), and low noise (e.g., 200 micro voltage root mean square (µVrms) or less). For instance, a wide baseband bandwidth may be desired in order to properly measure the distortion of the transmit signal generated by the transmit chains. As an example, the mixer-ADC interface 156/158 may need to operate with a baseband bandwidth of 1.5 to 2.5 times the bandwidth of the transmit signal to properly characterize the distortion in the transmit signal. If the transmit signal has a bandwidth of 300 MHz, then the mixer-ADC interface 156/158 should operate with a baseband bandwidth of 450 MHz to 750 MHz. The baseband bandwidth should also be tunable (e.g., from 100 MHz to 800 MHz) to properly characterize the distortion of the transmit signal when its bandwidth is smaller (e.g., 50 MHz) so as not to base the distortion on frequencies beyond 2.5 times the bandwidth of the signal.

Further, it may also be desirable for the feedback mixer-ADC 156/158 to have high linearity so that it does not add its own non-linearity to the feedback signal $D_{FB}$. In other words, it would be desirable for the measurement/tuning circuit 160 to consider only the non-linearity associated with the transmit chain in applying the predistortion to the transmit digital signal, and not the non-linearity of the feedback receiver. Additionally, it would be desirable for the measured distortion to be free from noise as much as possible in order to arrive at an accurate measurement of the distortion of the transmit signal so that accurate predistortion is applied to the transmit digital signal. The following describes such a mixer-ADC interface with the aforementioned attributes.

Figure 2:
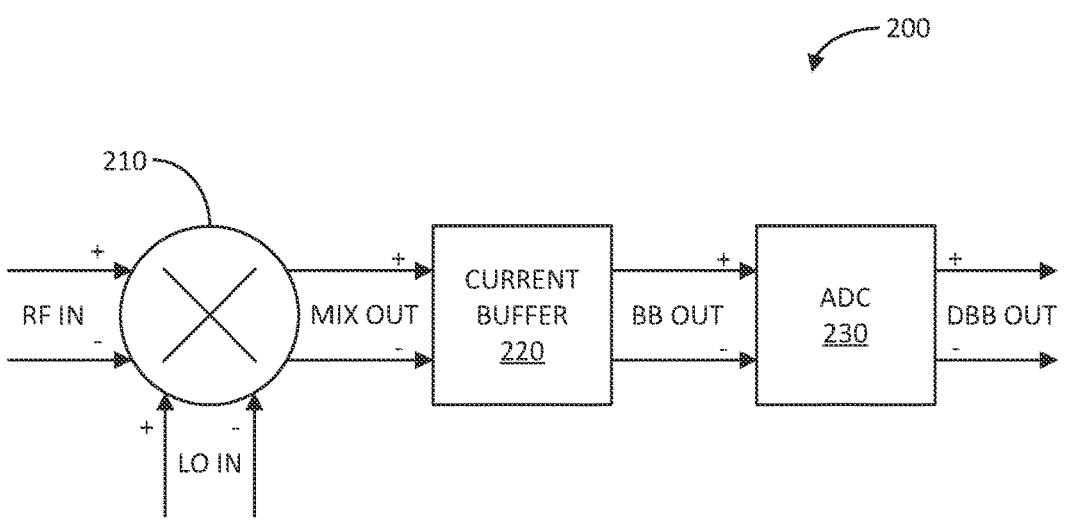
FIG. 2 illustrates a block diagram of an example radio frequency (RF) to baseband (BB) interface in accordance with another aspect of the disclosure.

FIG. 2 illustrates a block diagram of an example radio frequency (RF) to baseband (BB) interface 200 in accordance with another aspect of the disclosure. The RF-to-BB interface 200 includes a current-mode mixer 210, a current buffer 220, and an analog-to-digital converter (ADC) 230. With regard to the transmitter system 100, the current-mode mixer 210 may correspond to the feedback mixer 156, the ADC 230 may correspond to the feedback ADC 158, and the current buffer 220 may serve as an interface between the current-mode mixer 210 and the ADC 230. Although the RF-to-BB interface 200 is described with reference to a feedback receive path of the transmitter system 100, it shall be understood that the RF-to-BB interface 200 may be applicable to any type of receiver application, and not limited to only feedback receivers.

The current-mode mixer 210 includes an RF differential input configured to receive an RF signal (e.g., $V_{FBA}$ of transmitter system 100). The current-mode mixer 210 further includes an LO differential input configured to receive an LO signal (e.g., $V_{LO1}$ or $V_{LO2}$ of transmitter system 100).

The current-mode mixer 210 is configured to mix the RF signal with the LO signal to generate a mixed output signal at a differential output thereof. The current-mode mixer 210 may perform its mixing operation in the current domain for improved linearity and noise characteristics. Accordingly, the mixer output signal may be a current signal.

The current buffer 220 may perform the following operations: First, the current buffer 220 may be configured to amplify the mixer output signal based on a programmable current gain (M) to generate a BB output signal. Second, the current buffer 220 may be configured to filter the mixer output signal based on a programmable low pass filter (LPF) to remove higher frequency mixing products from the mixer output signal to generate the BB output signal. Third, the current buffer 220 may provide a relatively low and constant input impedance (e.g., around 20 Ohms ($\Omega$)) to maintain the current-mode mixer 210 operating substantially in a linear region. That is, the voltage swing at the output of the current-mode mixer 210 is the product of the mixer output current signal at the input impedance of the current buffer 220. Thus, to keep the voltage swing relatively low so as to avoid operating the mixer 210 in a non-linear region, it is desired for the input impedance of the current buffer 220 to be relatively low (e.g., additional benefits include lower FDRSB and/or GVOT). Finally, the current buffer 220 may be configured to generate the BB output signal such that a certain voltage swing is produced at the input of the ADC 230 to achieve a desired signal-to-noise ratio (SNR) in the analog-to-digital conversion of the BB output signal into a digital BB signal. The following describes several example implementations of such current buffer 220.

Figures 3, 4:
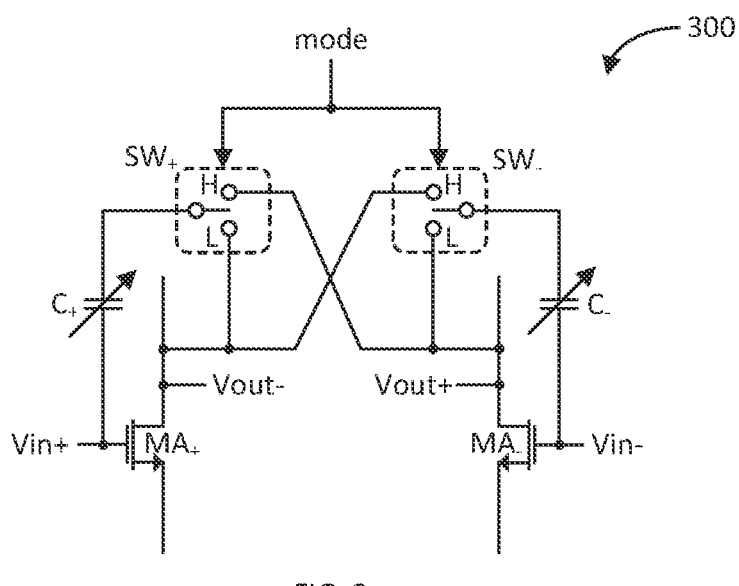
FIG. 3 illustrates a schematic diagram of an example buffer or amplifier in accordance with another aspect of the disclosure.
FIG. 4 illustrates a schematic diagram of an example current buffer or amplifier in accordance with another aspect of the disclosure.

FIG. 3 illustrates a schematic diagram of an example buffer (or amplifier/filter) 300 in accordance with another aspect of the disclosure. The buffer 300 is used to explain the relatively wide programmable bandwidth characteristic of the mixer-ADC interface previously mentioned. As discussed, it may be desirable for the mixer-ADC interface to have a relatively wide programmable bandwidth, especially for feedback receivers, because the transmit signal, whose distortion is to be characterized, may have a varying bandwidth, and to characterize the distortion, the bandwidth of the mixer-ADC interface should be three (3) to five (5) times the varying bandwidth of the transmit signal. Also, as previously mentioned, the bandwidth of the mixer-ADC interface may be as wide as 100 MHz to 800 MHz.

The buffer 300 includes a differential pair of input transistors $MA_+$ and $MA_-$, wherein each may be implemented as a field effect transistor (FET); or more specifically, as an n-channel metal oxide semiconductor (NMOS) FET (but may also be implemented as a p-channel metal oxide semiconductor (PMOS) FET). The NMOS FETs $MA_+$ and $MA_-$ include gates configured to receive positive and negative components of an input differential signal Vin+ and Vin−, respectively. The NMOS FETs $MA_+$ and $MA_-$ include drains configured to generate negative and positive components of an output differential signal Vout+ and Vout−, respectively. The buffer 300 may include additional components (not shown), such as active and/or passive output impedances, current sources, and biasing circuitry.

To effectuate programmable bandwidth, the buffer 300 includes a pair of variable capacitors $C_+$ and $C_-$, and a pair of single-pole-double-throw (SPDT) switching devices $SW_+$ and $SW_-$. The capacitor $C_+$ is coupled between the gate (positive input) of NMOS FET $MA_+$ and the pole of switching device $SW_+$. Similarly, the capacitor $C_-$ is coupled between the gate (negative input) of NMOS FET $MA_-$ and the pole of switching device $SW_-$. The L (which stands for low bandwidth (BW) mode) throws of the switching devices $SW_+$ and $SW_-$ are coupled to the drains (negative and positive outputs) of the NMOS FETs $MA_+$ and $MA_-$, respectively. Similarly, the H (which stands for high BW mode) throws of the switching devices $SW_+$ and $SW_-$ are coupled to the drains (positive and negative outputs) of the NMOS FETs $MA_-$ and $MA_+$, respectively. The switching devices $SW_+$ and $SW_-$ further include control inputs configured to receive a mode signal from a control circuit, such as the measurement/tuning circuit 160, for controlling the configuration of the switching devices $SW_+$ and $SW_-$.

If the switching devices $SW_+$ and $SW_-$ are configured to couple the poles to the L throws (the mode signal indicates low BW mode), then the capacitors $C_+$ and $C_-$ function as Miller capacitors. That is, the effective capacitance of the capacitors $C_+$ and $C_-$ is given by $C*(1+A_v)$, where C is the native capacitance of each of the capacitors $C_+$ and $C_-$ and $A_v$ is the voltage gain (Vout/Vin) of the buffer 300. The "amplification" of the capacitance is due to the voltages on either side of each of the capacitors $C_+$ and $C_-$ swinging in opposite directions. For example, considering the voltage across the capacitor $C_+$, when Vin+ increases, Vout− decreases; and when Vin+ decreases, Vout− increases. The same applies for the voltages on either side of the capacitor $C_-$. The voltages on either side of the capacitors moving in opposite direction has the effect of increasing the effective capacitance of the capacitors by a factor of one (1) plus the voltage gain $A_v$.

Configuring the capacitors $C_+$ and $C_-$ as Miller capacitors via the switching devices $SW_+$ and $SW_-$ results in the buffer 300 having a low pass filter (LPF) frequency response with a relatively low frequency pole. For example, if the voltage gain $A_v$ of the buffer 300 is 10, then the effective capacitance is 11 times the native capacitance of the capacitors $C_+$ and $C_-$. This is a relatively high capacitance, which translates to a relatively low frequency pole for the LPF response of the buffer 300. The capacitors $C_+$ and $C_-$ are made variable to fine tune the pole of the LPF response of the buffer 300. As a specific example, in low BW mode, the pole of the LPF response of the buffer 300 may be set between 100 MHz to 600 MHz by programming the capacitance of the variable capacitors $C_+$ and $C_-$.

If the switching devices $SW_+$ and $SW_-$ are configured to couple the poles to the H throws (the mode signal indicates high BW mode), then the capacitors $C_+$ and $C_-$ function as gate-drain (Cgd) neutralization capacitors. That is, the capacitors $C_+$ and $C_-$ neutralize the capacitance of the Cgd capacitances of the NMOS FETs $MA_+$ and $M_{A-}$, respectively. The neutralization of the gate-drain capacitance is due to the voltages on either side of the capacitors swinging in the same direction. For example, considering the voltage across the capacitor $C_+$, when Vin+ increases, Vout+ increases; and when Vin+ decreases, Vout+ decreases. The same applies for the voltages on either side of the capacitor $C_-$. The voltages on either side of the capacitors moving in same direction has the effect coupling the capacitors $C_+$ and $C_-$ in series with the Cgd of NMOS FETs $MA_+$ and $M_{A-}$; thereby, neutralizing the capacitance Cgd.

Configuring the capacitors $C_+$ and $C_-$ as Cgd neutralization capacitors via the switching devices $SW_+$ and $SW_-$ results in the buffer 300 having an LPF frequency response with a relatively high frequency pole. For example, as the capacitors $C_+$ and $C_-$ are made variable, the pole of the LPF response of the buffer 300 may be tuned to a particular high frequency. As a specific example, in high BW mode, the pole of the LPF response of the buffer 300 may be set between 600 MHz to 800 MHz by programming the capacitance of the variable capacitors $C_+$ and $C_-$.

FIG. 4 illustrates a schematic diagram of an example current buffer (or amplifier) 400 in accordance with another aspect of the disclosure. The buffer 400 is used to explain how adding current bleeders to a current buffer allows the biasing of the associated current mirror without significantly changing the input impedance. In this manner, the biasing of the current mirror may be done to achieve a particular linearity for the current buffer 400, while maintaining the input impedance relatively low so as not affect the linearity of the preceding mixer.

In particular, the current buffer 400 includes an input current mirror stage 410 and an output current mirror stage 420 for amplifying a differential input current $I_{in+}/I_{in-}$ to generate an output current $I_{out}$ through a load $R_L$. As an example, the differential input current $I_{in+}/I_{in-}$ may be generated by a current mixer, and the load $R_L$ may represent an ADC. The input current mirror stage 410 includes a first p-channel metal oxide semiconductor (PMOS) FET $MA_+$, a first NMOS FET $MB_+$, a second PMOS FET $MC_+$, and a second NMOS FET $MD_+$ coupled in series between an upper voltage rail Vdd and a lower voltage rail Vss (e.g., ground). Similarly, the input current mirror stage 410 includes a third PMOS FET $MA_-$, a third NMOS FET $MB_-$, a fourth PMOS FET $MC_-$, and a fourth NMOS FET $MD_-$ coupled in series between the upper voltage rail Vdd and the lower voltage rail Vss.

More specifically, the first PMOS FET $MA_+$ is diode-connected including a source coupled to the upper voltage rail Vdd, and gate and drain coupled together. The first PMOS FET $MA_+$ forms the upper- and positive-side input current mirror transistor of the input stage 410. The first NMOS FET $MB_+$ includes a drain coupled to the gate/drain of the first PMOS FET $MA_+$, a gate configured to receive a first bias voltage Vbn, and a source serving as a positive input of the current buffer 400. The first NMOS FET $MB_+$ forms the upper- and positive-side input transistor of a common gate configuration. The second PMOS FET $MC_+$ includes a source coupled to the positive input (source of the first NMOS FET $MB_+$) of the current buffer 400, and a gate configured to receive a second bias voltage Vbp. The second PMOS FET $MC_+$ forms the lower- and positive-side input transistor of the common gate configuration. The second NMOS FET $MD_+$ is diode-connected including gate and drain coupled together, and to the drain of the second PMOS FET $MC_+$, and a source coupled to the lower voltage rail Vss. The second NMOS FET $MD_+$ forms the lower- and positive-side input current mirror transistor of the input stage 410.

The third PMOS FET $MA_-$ is diode-connected including a source coupled to the upper voltage rail Vdd, and gate and drain coupled together. The third PMOS FET $MA_-$ forms the upper- and negative-side input current mirror transistor of the input stage 410. The third NMOS FET $MB_-$ includes a drain coupled to the gate/drain of the third PMOS FET $MA_-$, a gate configured to receive the first bias voltage Vbn, and a source serving as a negative input of the current buffer 400. The third NMOS FET $MB_-$ forms the upper- and negative-side input transistor of the common gate configuration. The fourth PMOS FET $MC_-$ includes a source coupled to the negative input (source of the third NMOS FET MB.) of the current buffer 400, and a gate configured to receive the second bias voltage Vbp. The fourth PMOS FET $MC_-$ forms the lower- and negative-side input transistor of the common gate configuration. The fourth NMOS FET $MD_-$ is diode-connected including gate and drain coupled together, and to the drain of the fourth PMOS FET $MC_-$, and a source coupled to the lower voltage rail Vss. The fourth NMOS FET $MD_-$ forms the lower- and negative-side input current mirror transistor of the input stage 410.

For allowing the linearity of the current buffer 400 to be controlled while maintaining (or controlling) the input impedance of the current buffer 400 to be substantially constant and at a relatively low impedance (e.g., around 20Ω), the input current mirror stage 410 includes a set of variable bleed current sources $I_{bl1+}$, $I_{bl1-}$, $I_{bl2+}$, and $I_{bl2-}$. The bleed current source $I_{bl1+}$, is coupled between the upper voltage rail Vdd and the gate/drain of the first PMOS MA. (e.g., in parallel with the first PMOS FET $MA_+$). The bleed current source $I_{bl1-}$ is coupled between the upper voltage rail Vdd and the gate/drain of the third PMOS $MA_-$ (e.g., in parallel with the third PMOS FET $MA_-$). The bleed current $I_{bl2+}$ is coupled between the gate/drain of the second NMOS FET $MD_+$ and the lower voltage rail Vss (e.g., in parallel with the second NMOS FET $MD_+$). The bleed current $I_{bl2-}$ is coupled between the gate/drain of the fourth NMOS FET $MD_-$ and the lower voltage rail Vss (e.g., in parallel with the fourth NMOS FET $MD_-$).

The output current mirror stage 420 includes inputs coupled to the gate/drain of the first PMOS $MA_+$, the gate/drain of the third PMOS $MA_-$, the gate/drain of the second NMOS FET $MD_+$, and the gate/drain of the fourth NMOS FET $MD_-$, respectively. The output current mirror stage 420 is configured to amplify the input current signal $I_{in+}/I_{in-}$ by a gain of M to generate the output current signal $I_{out}$. The gain M may be variable or programmable to control the voltage at the input of the load $R_L$, which, as discussed, may represent an ADC. For example, the gain M may be controlled to produce a voltage swing range at the input of the ADC load $R_L$ to achieve a certain SNR in the conversion of the ADC input signal into a digital signal. For linearity purpose, a higher gain M typically leads to improved linearity due to a lower signal (voltage/current) swing across the input current mirror transistors $MA_+$, $MA_-$, $MD_+$, and $MD_-$ of the input stage 410.

However, without the bleed current sources $I_{bl1+}$, $I_{bl1-}$, $I_{bl2+}$, and $I_{bl2-}$, increasing the gain M while maintaining the maximum voltage swing across the load $R_L$ substantially constant, the DC current through the input current mirror transistors $MA_+$, $MD_+$, $MA_-$, and $MD_-$ (and consequently, the DC current through the input transistors $MB_+$, $MC_+$, $MB_-$, and $MC_-$) may be reduced to bias the input stage 410 for improved linearity. This has the effect of reducing the transconductance gain of the input transistors $MB_+$, $MC_+$, $MB_-$, and $MC_-$, which results in increasing the input impedance of the current buffer 400. As previously discussed, increasing the input impedance of the current buffer 400 may adversely affect the linearity of the preceding mixer; which may cancel out the linearity improvement due to increasing the gain M.

Thus, when the gain M is increased and the DC current through the current mirror transistors $MA_+$, $MA_-$, $MD_+$, and $MD_-$ is reduced to improve the linearity of the current mirror of the current buffer 400, the bleed current sources $I_{bl1+}/I_{bl2+}$, and $I_{bl1-}/I_{bl2-}$ are operated to provide additional DC currents through the input transistors $MB_+/MC_-$ and $MB_-/MC_-$ so that the DC currents through these transistors are maintained substantially constant; and therefore, the input impedance of the current buffer 400 may be maintained substantially constant at a relatively low impedance (e.g., 200).

Figure 5A:
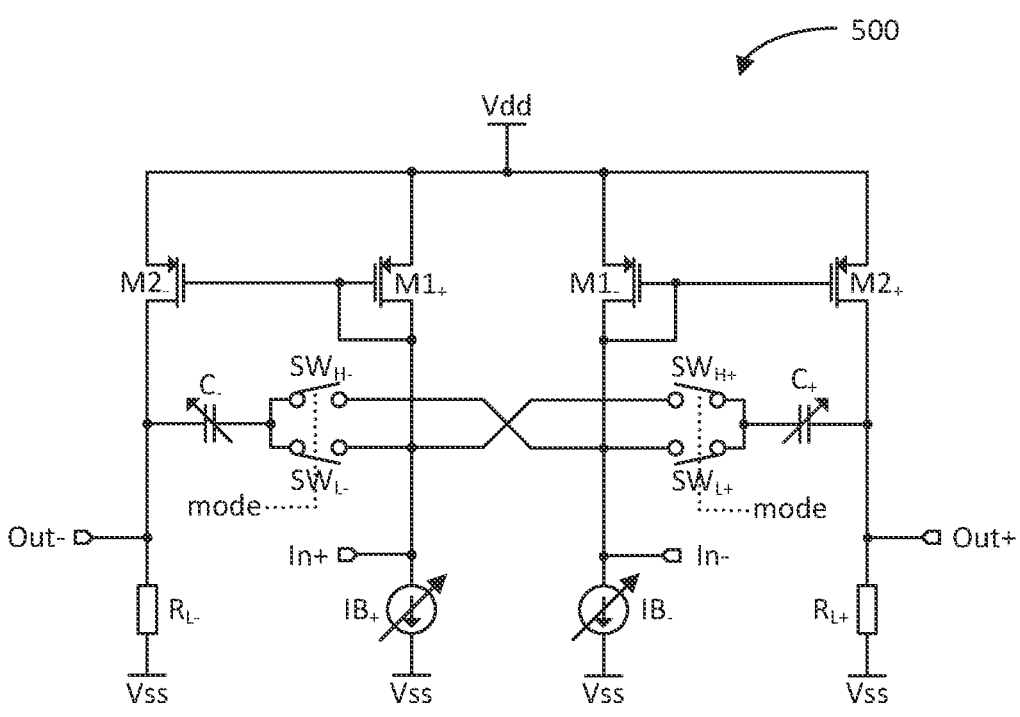
FIG. 5A illustrates a schematic diagram of another example current buffer or amplifier in accordance with another aspect of the disclosure.

FIG. 5A illustrates a schematic diagram of another example current buffer (or amplifier/filter) 500 in accordance with another aspect of the disclosure. The current buffer 500 is a more detailed implementation of a bandwidth reconfigurable buffer similar to buffer 300 previously described. That is, as discussed in more detail further herein, the current buffer 500 includes capacitors that may be reconfigurable as either Miller capacitors or Cgd neutralization capacitors to configure the current buffer 500 in a low BW mode or high BW mode, respectively. Also, as previously discussed, in low BW mode, the current buffer 500 may exhibit an LPF frequency response with a pole tunable within a first frequency range (e.g., 100 MHz to 600 MHz); and in high BW mode, the current buffer 500 may exhibit an LPF frequency response with a pole tunable within a second frequency range (e.g., 600 MHz to 800 MHz), the second frequency range being higher (although possibly overlapping) than the first frequency range.

More specifically, the current buffer 500 includes a first PMOS FET $M1_+$ coupled in series with a first bias current source $IB_+$ (which may be variable) between an upper voltage rail Vdd and a lower voltage rail Vss (e.g., ground). The first PMOS FET $M1_+$ is diode connected including a source coupled to the upper voltage rail Vdd, and gate and drain coupled together. The node between the first PMOS FET $M1_+$ and the first bias current source $IB_+$ serves as a positive node, which coincides with a positive input (In+) in this example, for an input differential current signal. A positive node, which may coincide with a positive differential input or an intermediate node, has a voltage that varies in the same direction as the positive component of an input differential signal.

The current buffer 500 further includes a second PMOS FET $M1_-$ coupled in series with a second bias current source IB. (which may be variable) between the upper voltage rail Vdd and the lower voltage rail Vss. The second PMOS FET ML is diode connected including a source coupled to the upper voltage rail Vdd, and gate and drain coupled together. The node between the second PMOS FET $M1_-$ and the second bias current source $IB_-$ serves as a negative node, which coincides with a negative input (In–) for the input differential current signal. Similarly, a negative node, which may coincide with a negative differential input or an intermediate node, has a voltage that varies in the same direction as the negative component of an input differential signal.

The current buffer 500 further includes a third PMOS FET $M2_+$ coupled in series with a first load $R_{L+}$ between the upper voltage rail Vdd and the lower voltage rail Vss. The third PMOS FET $M2_+$ includes a source coupled to the upper voltage rail Vdd, and a gate coupled to the gate/drain of the second PMOS FET $M1_-$. The node between the third PMOS FET M2+ and the first load resistor $R_{L+}$ serves as a positive output (Out+) for an output differential signal of the current buffer 500.

Additionally, the current buffer 500 includes a fourth PMOS FET $M2_-$ coupled in series with a second load $R_{L-}$ between the upper voltage rail Vdd and the lower voltage rail Vss. The fourth PMOS FET $M2_-$ includes a source coupled to the upper voltage rail Vdd, and a gate coupled to the gate/drain of the first PMOS FET $M1_+$. The node between the fourth PMOS FET $M2_-$ and the second load resistor $R_{L-}$ serves as a negative output (Out–) for the output differential signal of the current buffer 500.

For signal filtering operation, the current buffer 500 further includes a first capacitor $C_+$ (which may be variable) and a first set of switching devices $SW_{H+}$ and $SW_{L+}$. The first capacitor $C_+$ is coupled in series with the switching device $SW_{L+}$ between the positive output (Out+) and the negative input (In–) of the current buffer 500. The first capacitor $C_+$ is also coupled in series with the switching device $SW_{H+}$ between the positive output (Out+) and the positive input (In+) of the current buffer 500. The first set of switching devices $SW_{H+}$ and $SW_{L+}$ is configured to receive a mode signal to set its configuration.

Similarly, the current buffer 500 further includes a second capacitor $C_-$ (which may be variable) and a second set of switching devices $SW_{H-}$ and $SW_{L-}$. The second capacitor C– is coupled in series with the switching device $SW_{L-}$ between the negative output (Out–) and the positive input (In+) of the current buffer 500. The second capacitor $C_-$ is also coupled in series with the switching device $SW_{H-}$ between the negative output (Out–) and the negative input (In–) of the current buffer 500. The second set of switching devices $SW_{H-}$ and $SW_{L-}$ is configured to receive the mode signal to set its configuration.

In operation, if the switching devices $SW_{L+}$ and $SW_{L-}$ are set to their closed states, and the switching devices $SW_{H+}$ and $SW_{H-}$ are set to their open states in response to the mode signal indicating low BW mode, the first and second capacitors $C_+$ and $C_-$ function as Miller capacitors. This is because the voltages on either side of the capacitors $C_+$ and $C_-$ are moving in opposite directions, and the effective capacitance is their native capacitance multiplied by one (1) plus the voltage gain $A_v$ across the capacitors. Thus, the current buffer 500 operates in low BW mode, where the variable capacitors $C_+$ and $C_-$ may be tuned to achieve a LPF frequency pole within a first frequency range (e.g., 100 MHz to 600 MHz).

If the switching devices $SW_{L+}$ and $SW_{L-}$ are set to their open states, and the switching devices $SW_{H+}$ and $SW_{H-}$ are set to their closed states in response to the mode signal indicating high BW mode, the first and second capacitors $C_+$ and $C_-$ function as Cgd neutralization capacitors. This is because the voltages on either side of the capacitors $C_+$ and $C_-$ are moving in the same direction, and connected to neutralize the gate-drain capacitances of the PMOS FETs $M2_+$ and $M2_-$, respectively. Thus, the current buffer 500 operates in high BW mode, where the variable capacitors $C_+$ and $C_-$ may be tuned to achieve a LPF frequency pole within a second frequency range (e.g., 600 MHz to 800 MHz) higher than the first frequency range.

Figure 5B:
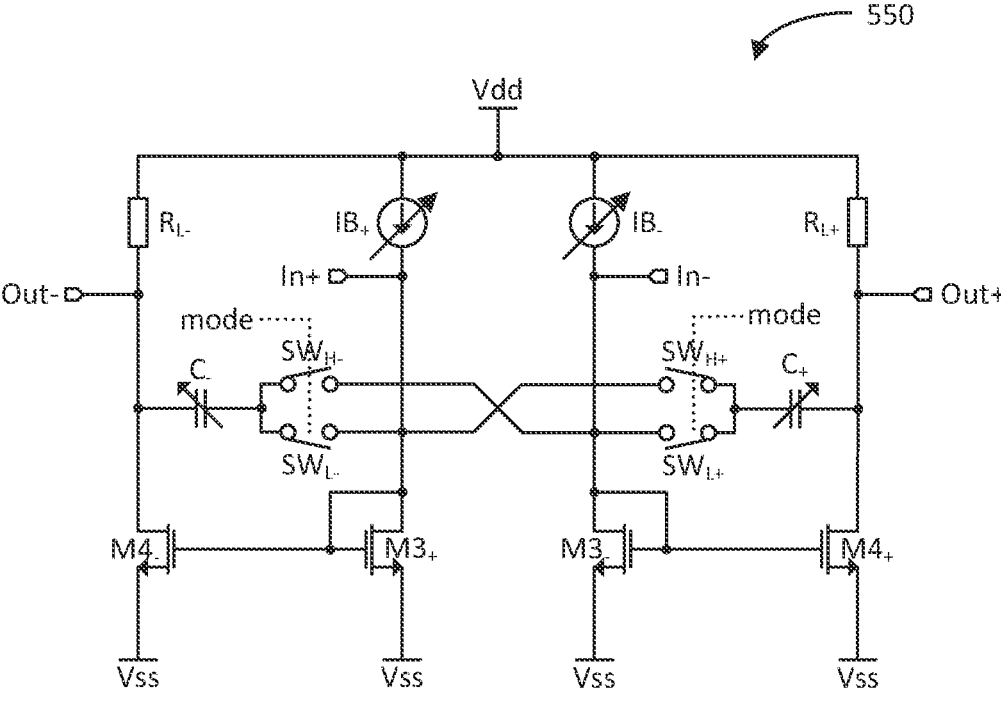
FIG. 5B illustrates a schematic diagram of another example current buffer or amplifier in accordance with another aspect of the disclosure.

FIG. 5B illustrates a schematic diagram of another example current buffer (or amplifier/filter) 550 in accordance with another aspect of the disclosure. The current buffer 550 is the NMOS FET version of the current buffer 500 previously discussed.

More specifically, the current buffer 550 includes a first bias current source IB. (which may be variable) coupled in series with a first NMOS FET $M3_+$ between an upper voltage rail Vdd and a lower voltage rail Vss (e.g., ground). The first NMOS FET M3, is diode connected including gate and drain coupled together, and a source coupled to the lower voltage rail Vss. The node between the first bias current source $IB_+$ and the first NMOS FET $M3_+$ serves as a positive node, which may coincide with a positive input (In+) in this example, for an input differential current signal of the current buffer 500. As previously discussed, a positive node, which may coincide with a positive differential input or an intermediate node, has a voltage that varies in the same direction as the positive component of an input differential signal.

The current buffer 550 further includes a second bias current source IB. (which may be variable) coupled in series with a second NMOS FET M3_ between the upper voltage rail Vdd and the lower voltage rail Vss. The second NMOS FET $M3_-$ is diode connected including gate and drain coupled together, and a source coupled to the lower voltage rail Vss. The node between the second bias current source $IB_-$ and the second NMOS FET $M3_-$ serves as a negative node, which coincides with a negative input (In−) in this example, for the input differential current signal. As previously discussed, a negative node, which may coincide with a negative differential input or an intermediate node, has a voltage that varies in the same direction as the negative component of an input differential signal.

The current buffer 550 further includes a first load $R_{L+}$ coupled in series with a third NMOS FET $M4_+$ between the upper voltage rail Vdd and the lower voltage rail Vss. The third NMOS FET $M4_+$ includes a gate coupled to the gate/drain of the second NMOS FET $M3_-$, and a source coupled to the lower voltage rail Vss. The node between the first load resistor $R_{L+}$ and the third NMOS FET $M4_+$ serves as a positive node, which may copositive output (Out+) for an output differential current signal of the current buffer 550.

Additionally, the current buffer 550 includes a second load $R_{L-}$ coupled in series with a fourth NMOS FET $M4_-$ between the upper voltage rail Vdd and the lower voltage rail Vss. The fourth NMOS FET $M4_-$ includes a gate coupled to the gate/drain of the first NMOS FET $M3_+$, and a source coupled to the lower voltage rail Vss. The node between the second load resistor $R_{L-}$ and the fourth NMOS FET $M4_-$ serves as a negative output (Out−) for the output differential current signal of the current buffer 550.

For signal filtering operation, the current buffer 550 further includes a first capacitor $C_+$ (which may be variable) and a first set of switching devices $SW_{H+}$ and $SW_{L+}$. The first capacitor $C_+$ is coupled in series with the switching device $SW_{L+}$ between the positive output (Out+) and the negative input (In−) of the current buffer 550. The first capacitor $C_+$ is also coupled in series with the switching device $SW_{H+}$ between the positive output (Out+) and the positive input (In$_+$) of the current buffer 550. The first set of switching devices $SW_{H+}$ and $SW_{L+}$ is configured to receive a mode signal to set its configuration.

Similarly, the current buffer 550 further includes a second capacitor $C_-$ (which may be variable) and a second set of switching devices $SW_{H-}$ and $SW_{L-}$. The second capacitor $C_-$ is coupled in series with the switching device $SW_-$ between the negative output (Out−) and the positive input (In+) of the current buffer 550. The second capacitor $C_-$ is also coupled in series with the switching device $SW_{H-}$ between the negative output (Out−) and the negative input (In−) of the current buffer 550. The second set of switching devices $SW_{H-}$ and $SW_{L-}$ is configured to receive the mode signal to set its configuration.

In operation, if the switching devices $SW_{L+}$ and $SW_{L-}$ are set to their closed states, and the switching devices $SW_{H+}$ and $SW_{H-}$ are set to their open states in response to the mode signal indicating low BW mode, the first and second capacitors $C_+$ and $C_-$ function as Miller capacitors. This is because the voltages on either side of the capacitors $C_+$ and $C_-$ are moving in opposite directions, and the effective capacitance is their native capacitance multiplied by one (1) plus the voltage gain $A_v$ across the capacitors. Thus, the current buffer 550 operates in low BW mode, where the variable capacitors $C_+$ and $C_-$ may be tuned to achieve a LPF frequency pole within a first frequency range (e.g., 100 MHz to 600 MHz).

If the switching devices $SW_{L+}$ and $SW_{L-}$ are set to their open states, and the switching devices $SW_{H+}$ and $SW_{H-}$ are set to their closed states in response to the mode signal indicating high BW mode, the first and second capacitors $C_+$ and $C_-$ function as Cgd neutralization capacitors. This is because the voltages on either side of the capacitors $C_+$ and $C_-$ are moving in the same direction, and connected to neutralize the gate-drain capacitances of the NMOS FETs $M4_+$ and $M4_-$, respectively. Thus, the current buffer 550 operates in high BW mode, where the variable capacitors $C_+$ and $C_-$ may be tuned to achieve a LPF frequency pole within a second frequency range (e.g., 600 MHz to 800 MHz) higher than the first frequency range.

Figures 5C, 5D:
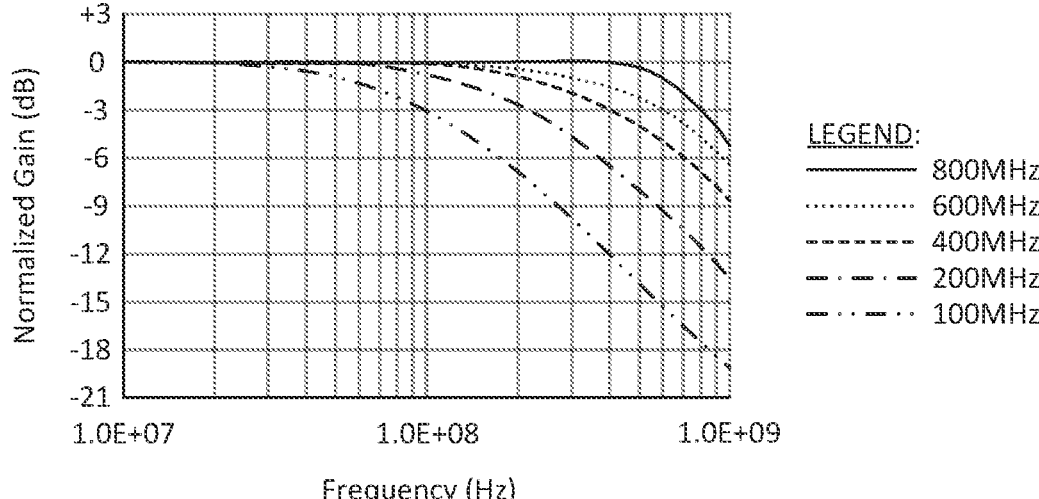
FIG. 5C illustrates a graph of an example gain over frequency response associated with the current buffer or amplifier of FIGS. 5A-5B in accordance with another aspect of the disclosure.
FIG. 5D illustrates a table of an example parameters for setting a bandwidth of the current buffer or amplifier of FIGS. 5A-5B in accordance with another aspect of the disclosure.

FIG. 5C illustrates a graph of an example gain over frequency response associated with the current buffer 500 or 550 in accordance with another aspect of the disclosure. The x- or horizontal-axis represents a logarithm scale of frequency ranging from 10 MHz to 1 giga Hertz (GHz). The y- or vertical-axis represents normalized gain ranging from +3 dB to −21 dB.

As the graph shows, the transfer function of the current buffer 500 or 550 may be programmed to achieve a low pass filter (LPF) response with various poles (e.g., five (5), as shown). For example, in low BW mode, the capacitors $C_+$ and $C_-$ may be tuned to achieve LPF frequency responses with poles at 100 MHz (shown as a dash-double-dot line). 200 MHz (shown as a dash-dot line), and 400 MHz (shown as a short dash line). In high BW mode, the capacitors $C_+$ and $C_-$ may be tuned to achieve LPF frequency responses with poles at 600 MHz (shown as a dotted line), and 800 MHz (shown as a solid line).

FIG. 5D illustrates a table of an example parameters for setting a bandwidth of the current buffer 500 or 550 in accordance with another aspect of the disclosure. The columns of the table from left-to-right represent the state of the high BW mode, the state of the low BW mode, the three (3) dB bandwidth (or the frequency of the LPF pole), and the capacitance of the capacitors $C_+$ and $C_-$.

As the table depicts, in low BW mode, as indicated in the second to fourth rows of the table, the capacitances of the capacitors $C_+$ and $C_-$ are set to 1.65 pico Farads (pF), 0.55 pF, and 0.15 pF to achieve bandwidths of 100 MHz, 200, MHz, and 400 MHz, respectively. In high BW mode, as indicated in the fifth and sixth rows of the table, the capacitances of the capacitors $C_+$ and $C_-$ are set to 0 pF and 0.35 pF to achieve bandwidths of 600 MHz and 800 MHz, respectively. Thus, the configuration of the current buffer 500 or 550 allows for a reconfigurable bandwidth of a factor of eight (8) with a maximum capacitance of 1.65 pF. This allows the current buffer 500 or 550 to be implemented in a circuit area efficient manner.

Figure 6A:
FIG. 6A illustrates a schematic diagram of another example current buffer or amplifier in accordance with another aspect of the disclosure.
Figure 6A:
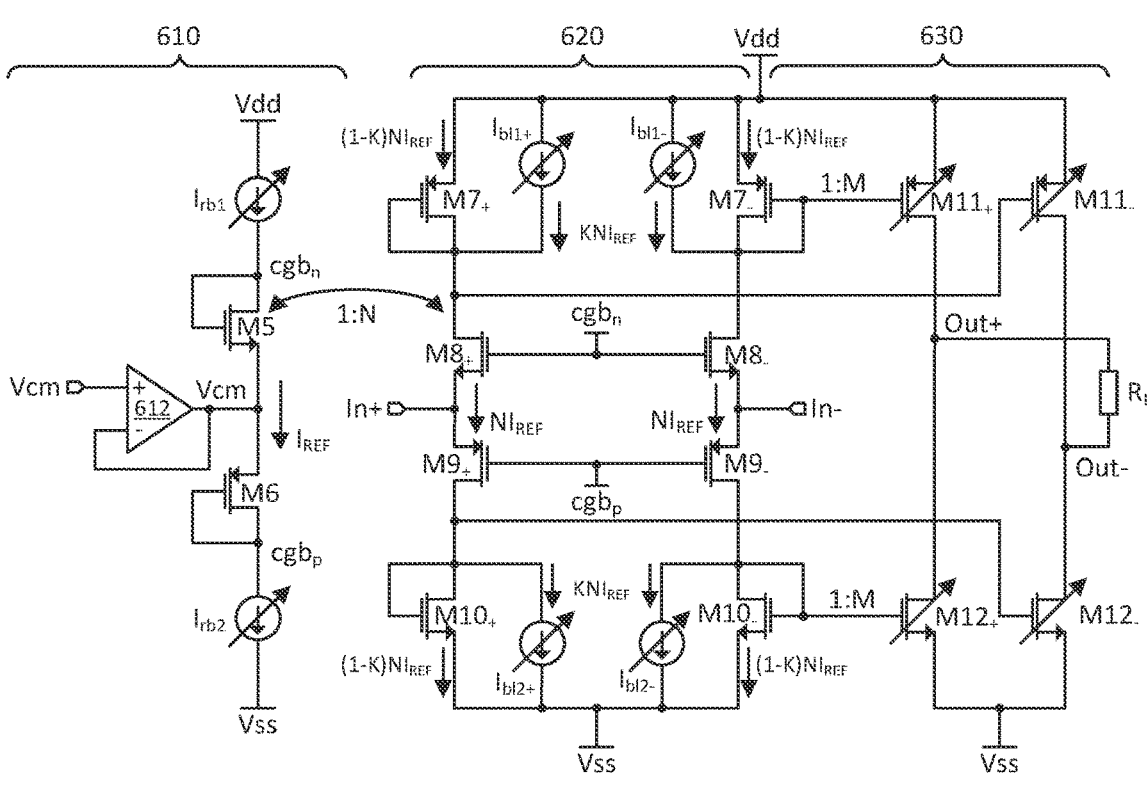

FIG. 6A illustrates a schematic diagram of another example current buffer (or amplifier) 600 in accordance with another aspect of the disclosure. The current buffer 600 is a more detailed implementation of a linearity and input impedance controllable buffer similar to buffer 400 previously described. That is, as discussed in more detail further herein, the current buffer 600 includes programmable or variable bleed current sources to maintain the current through input transistors substantially constant to achieve a relatively low input impedance (e.g., around 20Ω), while varying the DC bias of the of the input current mirror transistors. The varying of the DC bias of the input current mirror transistors may be done to set or improve the linearity of the current buffer 600. In particular, the current buffer 600 includes a replica bias circuit 610, an input current mirror stage 620, and an output current mirror stage 630.

The replica bias circuit 610 includes a first current source $I_{rb1}$ (which may be variable or programmable), a diode-connected NMOS FET M5, a diode-connected PMOS FET M6, and a second current source $I_{rb2}$ (which may also be variable or programmable), all coupled in series between an upper voltage rail Vdd and a lower voltage rail Vss (e.g., ground). In more detail, the first current source $I_{rb1}$ is coupled between the upper voltage rail Vdd and the gate/drain of the NMOS FET M5. The source of the NMOS FET M5 is coupled to the source of the PMOS FET M6. The second current source $I_{rb2}$ is coupled between the gate/drain of the PMOS FET M6 and the lower voltage rail Vss. The replica bias circuit 610 further includes an operational amplifier 612, configured as a voltage-follower or buffer, including a positive input configured to receive a target common mode voltage Vcm for setting the common mode voltage of the input current mirror stage 620, and a negative input and output coupled to the sources of NMOS FET M5 and PMOS FET M6.

As discussed in more detail herein, the first current source $I_{rb1}$ is a replica of upper current sources of the input current mirror stage 620, the diode-connected NMOS FET M5 is a replica of input common gate NMOS FETs of the input current mirror stage 620, the diode-connected PMOS FET M6 is a replica of input common gate PMOS FETs of the input current mirror stage 620, and the second current source $I_{rb2}$ is a replica of lower current sources of the input current mirror stage 620. The replica bias circuit 610 is configured to generate a reference current $I_{REF}$ through the NMOS FET M5 and PMOS FET M6 to generate first and second bias voltages $cgb_n$ and $cgb_p$ for the gates of the input common gate NMOS FETs and PMOS FETs of the input current mirror stage 620. The size or effective channel width to length ratio (W/L) of the input common gate NMOS FETs and PMOS FETs of the input current mirror stage 620 may be N times the size or effective W/L of the NMOS FET M5 and PMOS FET M6, so that the DC current flowing through the input NMOS FETs and PMOS FETs of the input current mirror stage 620 is $N*I_{REF}$.

The input current mirror stage 620 includes a positive current path including a diode-connected PMOS FET M7$_+$, an input common gate NMOS FET M8$_+$, an input common gate PMOS FET M9$_+$, and a diode-connected NMOS FET M10$_+$, all coupled in series between the upper voltage rail Vdd and the lower voltage rail Vss. In more detail, the PMOS FET M7$_+$ includes a source coupled to the upper voltage rail Vdd, and gate and drain coupled together. The NMOS FET M8$_+$ includes a drain coupled to the gate/drain of the PMOS FET M7$_+$, and a gate configured to receive the first bias voltage $cgb_n$, generated by the replica bias circuit 610. The PMOS FET M9+ includes a source coupled to the source of the NMOS FET M8$_-$, and a gate configured to receive the second bias voltage $cgb_p$ generated by the replica bias circuit 610. The NMOS FET M10$_+$ includes gate and drain coupled together, and to the drain of PMOS FET M9$_-$ and a source coupled to the lower voltage rail Vss. The positive current path also includes an upper variable bleed current source $I_{bl1+}$ coupled between the upper voltage rail Vdd and the gate/drain of PMOS FET M7$_+$ (e.g., in parallel with the PMOS FET M7$_-$); and a lower variable bleed current source $I_{bl2+}$ coupled between the gate/drain of NMOS FET M10$_+$ and the lower voltage rail Vss (e.g., in parallel with the NMOS FET M10$_+$).

The input current mirror stage 620 further includes a negative current path including a diode-connected PMOS FET M7$_-$, an input common gate NMOS FET M8$_-$, an input common gate PMOS FET M9$_-$, and a diode-connected NMOS FET M10$_-$, all coupled in series between the upper voltage rail Vdd and the lower voltage rail Vss. In more detail, the PMOS FET M7$_-$ includes a source coupled to the upper voltage rail Vdd, and gate and drain coupled together. The NMOS FET M8$_-$ includes a drain coupled to the gate/drain of the PMOS FET M7$_-$, and a gate configured to receive the first bias voltage $cgb_n$. The PMOS FET M9$_-$ includes a source coupled to a source of the NMOS FET M8$_-$, and a gate configured to receive the second bias voltage $cgb_p$. The NMOS FET M10$_-$ includes gate and drain coupled together, and to the drain of PMOS FET M9$_-$, and a source coupled to the lower voltage rail Vss. The negative current path also includes an upper variable bleed current source $I_{bl1-}$ coupled between the upper voltage rail Vdd and the gate/drain of PMOS FET M7$_-$ (e.g., in parallel with the PMOS FET M7$_-$); and a lower variable bleed current source $I_{bl2-}$ coupled between the gate/drain of NMOS FET M10$_-$ and the lower voltage rail Vss (e.g., in parallel with the NMOS FET M10$_-$).

The output current mirror stage 630 includes a positive current path including PMOS FET M11$_+$ coupled in series with NMOS FET M12$_+$ between the upper voltage rail Vdd and the lower voltage rail Vss. The gate of PMOS FET M11+ is coupled to the gate/drain of PMOS FET M7$_-$. The gate of NMOS FET M12$_+$ is coupled to the gate/drain of NMOS FET M10$_-$. The output current mirror stage 630 includes a negative current path including PMOS FET M11$_-$ coupled in series with NMOS FET M12$_-$ between the upper voltage rail Vdd and the lower voltage rail Vss. The gate of PMOS FET M11$_-$ is coupled to the gate/drain of PMOS FET M7$_+$. The gate of NMOS FET M12$_-$ is coupled to the gate/drain of NMOS FET M10$_-$.

The sources of the NMOS FET M8$_+$ and PMOS FET M9$_+$ serve as a positive input (In+) for an input differential current signal. The sources of the NMOS FET M8$_-$ and PMOS FET M9$_-$ serve as a negative input (In−) for the input differential current signal. The sources of the PMOS FET M11$_+$ and NMOS FET M12$_+$ serve as a positive output (Out+) for an output differential current signal. The sources of the PMOS FET M11$_-$ and NMOS FET M12$_-$ serve as a negative output (Out−) for the output differential current signal. A load $R_L$ (e.g., an input of an ADC) is coupled between the positive output (Out+) and the negative output (Out−) of the current buffer 600.

The size or W/L of the output current mirror PMOS FETs M11+/M11− and NMOS FETs M12+/M12− of the output stage 630 may be M times the size or W/L of the input current mirror PMOS FETs M7$_+$/M7$_-$ and NMOS FETs M10$_+$/M10$_-$ of the input stage 620 to achieve a current gain of M between the output differential current signal and the input differential current signal, where M is variable or programmable. The variable M may be set to produce a particular voltage swing range at the input of the ADC load $R_L$ in order to achieve a certain SNR in the conversion of the output differential signal into a digital signal. If the maximum voltage swing at the ADC load $R_L$ is maintained constant to achieve the desired SNR, and the current gain M is increased, the DC current through the PMOS FETs M7$_+$/M7$_-$ and NMOS FETs M10$_+$/M10$_-$ of the input current mirror stage 620 may be decreased to bias the input current mirror stage 620 for improved linearity. If the bleed current sources $I_{bl1+}/I_{bl1-}$ and $I_{bl2+}/I_{bl2-}$ are not present, the decreased DC current would flow through the input transistors M8$_+$/M8$_-$ and M9$_+$/M9$_-$, which would increase the input impedance of the current buffer 600.

Thus, as the current gain M is changed to achieve a certain voltage swing across the load $R_L$ and/or a certain linearity for the current buffer 600, the bleed current sources $I_{bl1+}/I_{bl1-}$ and $I_{bl2+}/I_{bl2-}$ are programmed to generate a DC current such that the current through the input transistors M8$_+$/M8$_-$ and M9$_+$/M9$_-$ is maintained substantially constant to achieve a substantially constant low impedance (e.g., around $20\Omega$). For example, the DC current through the input transistors $M8_+/M8_-$ and $M9_+/M9_-$ is at $N*I_{REF}$ due to the current gain N between the input current mirror stage 620 and the replica bias circuit 610. If the DC current through the transistor PMOS FETs $M7_+/M7_-$ and NMOS FETs $M10_+/M10_-$ of the input current mirror stage 620 is decreased to $(1-K)*N*I_{REF}$ for SNR and/or linearity considerations (where K is a number between 0 and 1), then the bleed current sources $I_{bl1+}/I_{bl1-}$ and $I_{bl2+}/I_{bl2-}$ are programmed to generate a DC current $K*N*I_{REF}$ to maintain the DC current through the input transistors $M8_+/M8_-$ and $M9_+/M9_-$ substantially constant at $N*I_{REF}$.

Figure 6B:
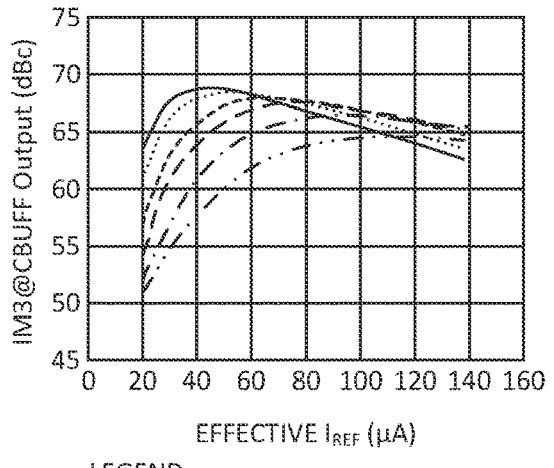
FIG. 6B illustrates a graph of an example linearity over effective reference current associated with the current buffer or amplifier of FIG. 6A in accordance with another aspect of the disclosure.

FIG. 6B illustrates a graph of an example linearity over effective reference DC current associated with the current buffer 600 in accordance with another aspect of the disclosure. The x- or horizontal-axis represents effective reference DC current in micro Ampere (μA) ranging from 0 μA to 160 μA. The effective DC current is the current $(1-K)*I_{REF}$ flowing through the replica bias circuit 610 that achieves a DC current $(1-K)*N*I_{REF}$ flowing in the input current mirror stage 620 if the bleed current sources $I_{bl1+}/I_{bl1-}$ and $I_{bl2+}/I_{bl2-}$ are not present. The y- or vertical-axis represents linearity of the output of the current buffer 600 as represented by the third-order intermodulation distortion product (IM3) in dBc ranging from 45 dBc to 75 dBc.

The graph depicts the IM3 versus effective $(1-K)*I_{REF}$ responses for current gains M of –10 dB (shown as a dash-double-dot line), –6 dB (shown as a dash-dot line), –2.5 dB (shown as a long dash line), 0 dB (shown as a short dash line), +3.5 dB (shown as a dotted line), and +5.75 dB (shown as a solid line). These responses indicate that a higher gain M typically leads to improved linearity due to a lower signal (voltage/current) swing across the input current mirror transistors $M7_+$, $M7_-$, $M10_+$, and $M10_-$ of the input stage 620. The responses also indicate that lowering the effective reference current $(1-K)*I_{REF}$ to a certain point also improves the linearity of the current buffer 600. For example, the maximum linearity at around 69 dBc may be achieved with an effective reference current $(1-K)*I_{REF}$ of about 40 μA. This is because lowering the effective reference current $(1-K)*I_{REF}$ reduces the non-linearity of the transistors $M7_+/M7_-$ and $M10_+/M10_-$ of the input current mirror stage 620.

Figure 6C:
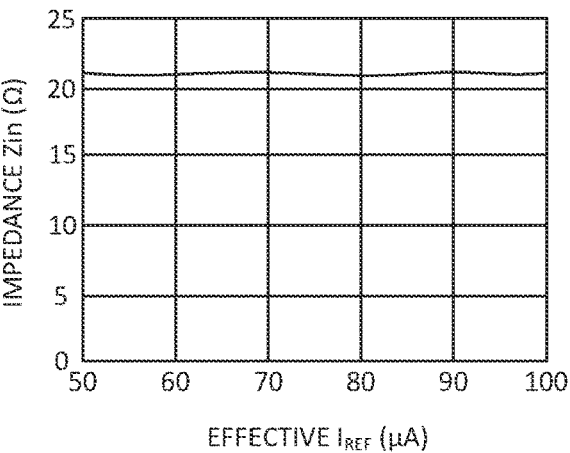
FIG. 6C illustrates a graph of an example input impedance over effective reference current associated with the current buffer or amplifier of FIG. 6A in accordance with another aspect of the disclosure.

FIG. 6C illustrates a graph of an example input impedance over effective reference DC current $(1-K)*I_{REF}$ associated with the current buffer 600 in accordance with another aspect of the disclosure. The x- or horizontal-axis represents effective reference DC current in μA ranging from 50 μA to 100 μA. The y- or vertical-axis represents the input impedance Zin of the current buffer 600 ranging from 0Ω to 25Ω. As the graph illustrates, the input impedance Zin is substantially constant at a relatively low impedance of about 21Ω with the effective reference current $(1-K)*I_{REF}$ varying from 50 μA to 100 μA due to a varying K. This is because the bleeder currents sources $I_{bl1+}/I_{bl1-}$ and $I_{bl2+}/I_{bl2-}$ also provide a current $K*N*I_{REF}$, which also varies with K, such that the current through each of the input transistors $M8_+/M8_-$ and $M9_+/M9_-$ is maintained substantially constant. As a result, the transconductance gain of the input transistors $M8_+/M8_-$ and $M9_+/M9_-$ remains substantially constant; and, as a consequence, the input impedance Zin remains substantially constant, and may be set to a relatively low impedance (e.g., around 21Ω).

FIG. 7A illustrates a schematic diagram of another example current buffer (or amplifier) 700 in accordance with another aspect of the disclosure. The current buffer 700 is similar to that of current buffer 600 with the exception that the transistors of the input and output current mirror stages are stacked for improved linearity and noise characteristics. Similarly, the current buffer 700 includes a replica bias circuit 710, an input current mirror stage 720, and an output current mirror stage 730.

The replica bias circuit 710 includes a first current source $I_{rb1}$ (which may be variable or programmable), a diode-connected NMOS FET M13, a diode-connected PMOS FET M14, and a second current source $I_{rb2}$ (which may also be variable or programmable), all coupled in series between an upper voltage rail Vdd and a lower voltage rail Vss (e.g., ground). In more detail, the first current source $I_{rb1}$ is coupled between the upper voltage rail Vdd and gate/drain of the NMOS FET M13. The source of the NMOS FET M13 is coupled to the source of the PMOS FET M14. The second current source $I_{rb2}$ is coupled between gate/drain of the PMOS FET M14 and the lower voltage rail Vss. The replica bias circuit 710 further includes an operational amplifier 712, configured as a voltage-follower or buffer, including a positive input configured to receive a target common mode voltage Vcm for setting the common mode voltage of the input current mirror stage 720, and a negative input and output coupled to the sources of NMOS FET M13 and PMOS FET M14.

Similarly, the first current source $I_{rb1}$ is a replica of upper current sources of the input current mirror stage 720, the diode-connected NMOS FET M13 is a replica of input common gate NMOS FETs of the input current mirror stage 720, the diode-connected PMOS FET M14 is a replica of input common gate PMOS FETs of the input current mirror stage 720, and the second current source $I_{rb2}$ is a replica of lower current sources of the input current mirror stage 720. The replica bias circuit 710 is configured to generate a reference current $I_{REF}$ through the NMOS FET M13 and PMOS FET M14 to generate first and second bias voltages $cgb_n$ and $cgb_p$ for the gates of the input common gate NMOS FETs and PMOS FETs of the input current mirror stage 720. The size or effective W/L of the input common gate NMOS FETs and PMOS FETs of the input current mirror stage 720 may be N times the size or effective W/L of the NMOS FET M13 and PMOS FET M14, so that the DC current flowing through the input NMOS FETs and PMOS FETs of the input current mirror stage 720 is $N*I_{REF}$.

The input current mirror stage 720 includes a positive current path including a diode-connected stacked PMOS FETs $M15_+$ and $M16_+$, an input common gate NMOS FET $M17_+$, an input common gate PMOS FET $M18_+$, and a diode-connected stacked NMOS FETs $M19_+$ and $M20_+$, all coupled in series between the upper voltage rail Vdd and the lower voltage rail Vss. In more detail, the stacked PMOS FET $M15_+$ includes a source coupled to the upper voltage rail Vdd, a gate coupled to gate and drain of stacked PMOS FET $M16_+$, and a drain coupled to a source of stacked PMOS FET $M16_+$. The NMOS FET $M17_+$ includes a drain coupled to the gate/drain of the stacked PMOS FET $M16_+$, and a gate configured to receive the first bias voltage $cgb_n$ generated by the replica bias circuit 710. The PMOS FET $M18_+$ includes a source coupled to a source of the NMOS FET $M17_+$, and a gate configured to receive the second bias voltage $cgb_p$ generated by the replica bias circuit 710. The stacked NMOS FET $M19_+$ includes gate and drain coupled together, to the gate of stacked PMOS FET $M20_+$, and to the drain of PMOS FET $M18_+$, and a source coupled to a drain of stacked NMOS FET $M20_+$. The stacked NMOS FET $M20_+$ includes a source coupled to the lower voltage rail Vss. The positive current path also includes an upper variable bleed current source $I_{bl1+}$ coupled between the upper voltage rail Vdd and the gate/drain of stacked PMOS FET $M16_+$ (e.g., in parallel with the stacked PMOS FETs $M15_+$ and $M16_+$); and a lower variable bleed current source $I_{bl2+}$ coupled between the gate/drain of PMOS FET $M19_+$ and the lower voltage rail Vss (e.g., in parallel with the stacked NMOS FETs $M19_+$ and $M20_+$).

The input current mirror stage 720 further includes a negative current path including diode-connected stacked PMOS FETs $M15_-$ and $M16_-$, an input common gate NMOS FET $M17_-$, an input common gate PMOS FET $M18_-$, and a diode-connected stacked NMOS FETs $M19_-$ and $M20_-$, all coupled in series between the upper voltage rail Vdd and the lower voltage rail Vss. In more detail, the stacked PMOS FET $M15_-$ includes a source coupled to the upper voltage rail Vdd, a gate coupled to gate and drain of stacked PMOS FET $M16_-$, and a drain coupled to the source of PMOS FET $M16_-$. The NMOS FET $M17_-$ includes a drain coupled to the gate/drain of the stacked PMOS FET $M16_-$, and a gate configured to receive the first bias voltage $cgb_n$. The PMOS FET $M18_-$ includes a source coupled to a source of NMOS FET $M17_-$, and a gate configured to receive the second bias voltage $cgb_p$. The stacked NMOS FET $M19_-$ includes a drain coupled to its gate, to the gate of stacked NMOS FET $M20_-$, and to the drain of PMOS FET $M18_-$. The stacked NMOS FET $M19_-$ includes a source coupled to a drain of stacked NMOS FET $M20_-$. The stacked NMOS FET M20 includes a source coupled to the lower voltage rail Vss. The negative current path also includes an upper variable bleed current source $I_{bl1-}$ coupled between the upper voltage rail Vdd and the gate/drain of PMOS FET $M16_-$ (e.g., in parallel with the stacked PMOS FETs $M15_-$ and $M16_-$); and a lower variable bleed current source $I_{bl2-}$ coupled between the gate/drain of PMOS FET $M19_-$ and the lower voltage rail Vss (e.g., in parallel with the stacked NMOS FETs $M19_-$ and $M20_-$).

The output current mirror stage 730 includes a positive current path including stacked PMOS FETs $732_+$ coupled in series with stacked NMOS FETs $734_+$ between the upper voltage rail Vdd and the lower voltage rail Vss. The gates of the stacked PMOS FETs $732_+$ is coupled to the gate/drain of PMOS FET $M16_-$. The gates of the stacked NMOS FET $734_+$ is coupled to the gate/drain of NMOS FET $M19_-$. The output current mirror stage 730 further includes a negative current path including stacked PMOS FETs $732_-$ coupled in series with stacked NMOS FETs $734_-$ between the upper voltage rail Vdd and the lower voltage rail Vss. The gate of the stacked PMOS FETs $732_-$ is coupled to the gate/drain of PMOS FET $M16_+$. The gate of the stacked NMOS FET $734_-$ is coupled to the gate/drain of NMOS FET $M19_+$.

The sources of the NMOS FET $M17_+$ and PMOS FET $M18_+$ serve as a positive input (In+) for an input differential current signal. The sources of the NMOS FET $M17_-$ and PMOS FET $M18_-$ serve as a negative input (In−) for the input differential current signal. The sources of the bottom stacked PMOS FET $732_+$ and top stacked NMOS FET $734_+$ serve as a positive output (Out+) for an output differential current signal. The sources of the bottom stacked PMOS FET $732_-$ and the top stacked NMOS FET $734_-$ serve as a negative output (Out−) for the output differential current signal. A load $R_L$ (e.g., an input of an ADC) is coupled between the positive output (Out+) and the negative output (Out−) of the current buffer 700.

The size or W/L of the stacked PMOS FETs $732_+/732_-$ and stacked NMOS FETs $734_+/734_-$ of the output current mirror stage 730 may be M times the size or W/L of the stacked PMOS FETs $M15_--M16_+/M15_--M16_-$ and stacked NMOS FETs $M19_+-M20_+/M19_--M20_-$ of the input current mirror stage 720 to achieve a current gain of M between the output differential current signal and the input differential current signal, where M is variable or programmable. As in current buffer 600, the variable M may be set to produce a voltage swing range at the input of the ADC load $R_L$ in order to achieve a certain SNR in the conversion of the output differential signal into a digital signal. If the maximum voltage swing at the ADC load $R_L$ is maintained constant to achieve the desired SNR, and the current gain M is increased, then the DC current through the stacked PMOS FETs $M15_+-M16_+/M15_--M16_-$ and stacked NMOS FETs $M19_+-M20_+/M19_--M20_-$ of the input current mirror stage 720 decreases. If the bleed current sources $I_{bl1+}/I_{bl1-}$ and $I_{bl2+}/I_{bl2-}$ are not present, the decreased DC current would flow through the input transistors $M8_+/M8_-$ and $M9_+/M9_-$, which would increase the input impedance of the current buffer 700.

Thus, as the current gain M is changed to achieve a certain maximum voltage swing across the load $R_L$ and/or a certain linearity for the current buffer 700, the bleed current sources $I_{bl1+}/I_{bl1-}$ and $I_{bl2+}/I_{bl2-}$ are programmed to generate a DC current such that the DC current through the input transistors $M17_+/M17_-$ and $M18_+/M18_-$ is maintained substantially constant to achieve a substantially constant low impedance (e.g., around 20Ω), as previously discussed in detail with regard to current buffer 600. As discussed further herein, the stacked PMOS FETs and NMOS FETs of the input current mirror stage 720, and the stacked PMOS FETs and NMOS FETs of the output current mirror stage 730 may improve the linearity and noise characteristics of the current buffer 700.

FIG. 7B illustrates a graph of an example linearity over effective reference DC current associated with the current buffer 700 in accordance with another aspect of the disclosure. The x- or horizontal-axis represents the effective reference DC current ranging from 0 µA to 160 µA. The y- or vertical-axis represents linearity of the output of the current buffer 700 as represented by the IM3 in dBc ranging from 55 dBc to 75 dBc.

The graph depicts the IM3 versus effective current reference responses for stacked input and output current mirror transistors (shown as a solid line) and non-stacked input and output current mirror transistors (shown as a dash line). As illustrated, the linearity of the current buffer 700 is generally improved for the stacked current mirror transistors compared to the non-stacked current mirror transistors. This is because the transistors of the stacked transistors closer to the voltage rails Vdd and Vss function as source degeneration for the other transistors of the stacked transistors. As such, the transconductance gain of the stacked transistors further away from the voltage rails Vdd and Vss is reduced; thereby, improving the linearity of the current buffer 700. In this particular example, an optimal linearity of 72 dBc is achieved for the stacked current mirror transistor implementation when the effective reference DC current is set to about 50 µA.

FIG. 7C illustrates a graph of an example noise versus gain response associated with the current buffer 700 in accordance with another aspect of the disclosure. The x- or horizontal-axis of the graph represents the current gain M of the current buffer 700 ranging from 0 dB to 6 dB. The y- or vertical-axis represents integrated noise in the frequency range of 2 kilo Hertz (KHz) to 200 MHz in micro voltage root mean square (µVrms) ranging from 50 µVrms to 300 µVrms. The graph depicts the noise versus current gain M for stacked input and output current mirror transistors (shown as a solid line) and non-stacked input and output current mirror transistors (shown as a dash line).

As illustrated, the noise characteristic of the current buffer 700 is significantly improved for the stacked current mirror transistors compared to the non-stacked current mirror transistors. For similar reasons, the improvement in the noise characteristics is due to the transistors of the stacked transistors closer to the voltage rails Vdd and Vss functioning as source degeneration for the other transistors of the stacked transistors. As such, the transconductance gain of the stacked transistors further away from the voltage rails Vdd and Vss is reduced; thereby, reducing the noise generated by the current buffer 700.

Figure 8:
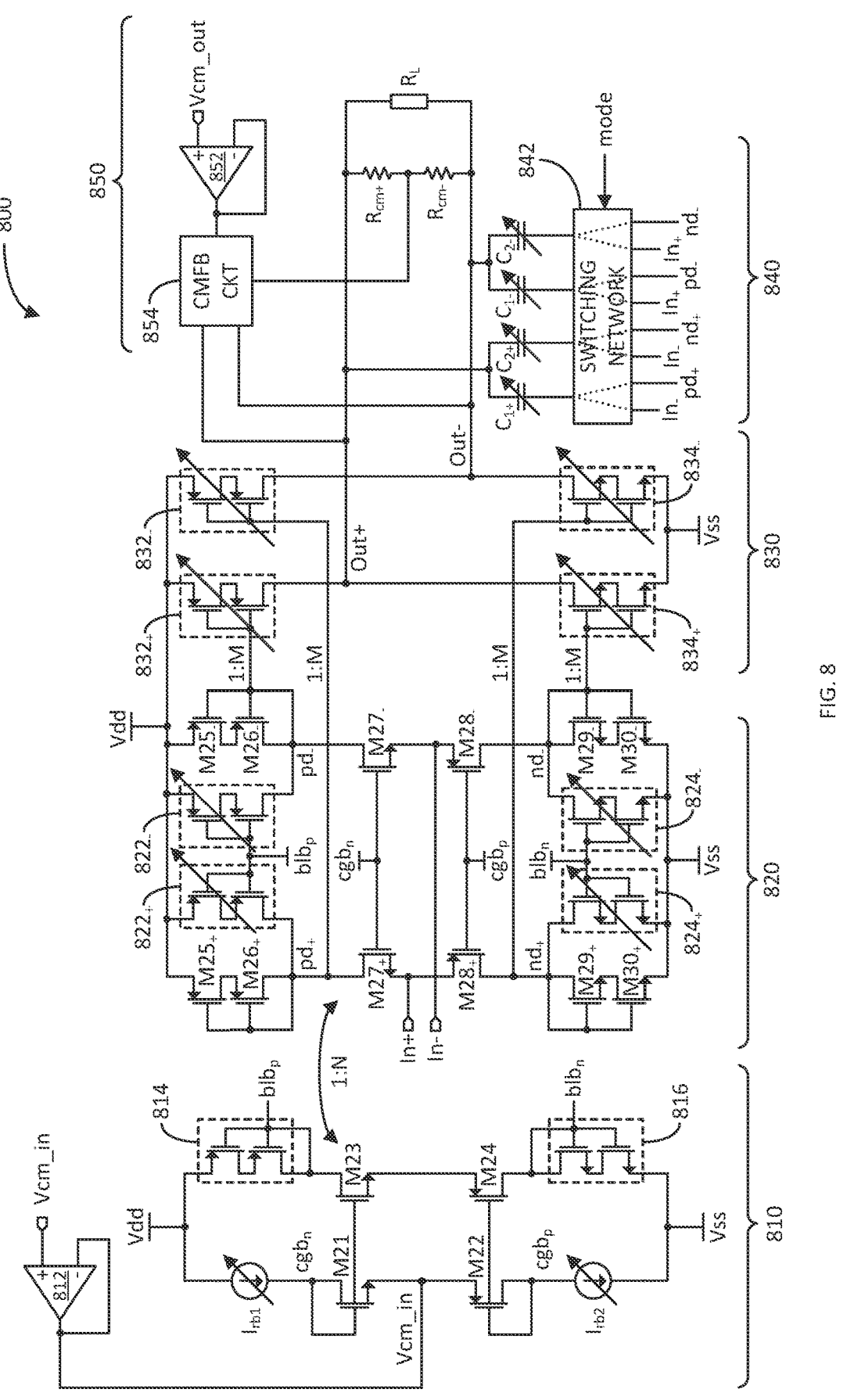
FIG. 8 illustrates a schematic diagram of another example current buffer or amplifier in accordance with another aspect of the disclosure.

FIG. 8 illustrates a block diagram of another example current buffer (or amplifier/filter) 800 in accordance with another aspect of the disclosure. The current buffer 800 combines many of the features previously discussed including: (1) the reconfigurable bandwidth by repurposing capacitors as Miller capacitors or Cgd neutralization capacitors: (2) the bleed current sources to control the input impedance of the current buffer 800 while changing the bias of the current mirror transistors of the input current mirror stage; (3) the stacked current mirror transistors of the current mirror for improved linearity and noise characteristics; and (4) the variable or programmable current gain M and variable or programmable effective reference current $(1-K)*I_{REF}$ to set the linearity of the current buffer 800 as desired. In particular, the current buffer 800 includes a replica bias circuit 810, an input current mirror stage 820, an output current mirror stage 830, a reconfigurable bandwidth circuit 840, and an output common voltage control circuit 850.

The replica bias circuit 810 includes a first current path including a first current source $I_{rb1}$ (which may be variable or programmable), a diode-connected NMOS FET M21, a diode-connected PMOS FET M22, and a second current source $I_{rb2}$ (which may also be variable or programmable), all coupled in series between an upper voltage rail Vdd and a lower voltage rail Vss (e.g., ground). In more detail, the first current source $I_{rb1}$ is coupled between the upper voltage rail Vdd and gate/drain of the NMOS FET M21. The NMOS FET M21 includes a source coupled to a source of the PMOS FET M22. The second current source $I_{rb2}$ is coupled between gate/drain of the PMOS FET M22 and the lower voltage rail Vss. The replica bias circuit 810 further includes an operational amplifier 812, configured as a voltage-follower or buffer, including a positive input configured to receive an input target common mode voltage Vcm_in for setting the common mode voltage of the input current mirror stage 820, and a negative input and output coupled to the sources of NMOS FET M21 and PMOS FET M22.

The replica bias circuit 810 further includes a second current path including diode-connected stacked PMOS FETs 814, an NMOS FET M23, a PMOS FET M24, and a diode-connected stacked NMOS FETs 816, all coupled in series between the upper voltage rail Vdd and the lower voltage rail Vss. In more detail, the diode-connected stacked PMOS FETs 814 is coupled between the upper voltage rail Vdd and the drain of the NMOS FET M23. The NMOS FET M23 includes a gate coupled to the gate/drain of NMOS FET M21, and a source coupled to a source of the PMOS FET M24. The PMOS FET M24 includes a gate coupled to the gate/drain of PMOS FET M22. The diode-connected stacked NMOS FETs 816 is coupled between drain of the PMOS FET M24 and the lower voltage rail Vss.

The first current source $I_{rb1}$ may be a variable replica of each of the diode-connected stacked PMOS FETs M25$_+$/M26$_+$ and M25$_-$/M26$_-$ of the input current mirror stage 820, the diode-connected stacked PMOS FETs 814 may be a replica of each of the stacked PMOS FETs variable bleed current sources 822+ and 822− of the input current mirror stage 820, the NMOS FETs M21 and M23 are replicas of input common gate NMOS FETs M27$_+$ and M27$_-$ of the input current mirror stage 820, the PMOS FETs M22 and M24 are replicas of input common gate PMOS FETs M28$_+$ and M28$_-$ of the input current mirror stage 820, the second current source $I_{rb2}$ is a variable replica of each of the diode-connected stacked NMOS FETs M29$_+$/M30$_+$ and M29$_-$/M30$_-$ of the input current mirror stage 820, and the stacked NMOS FETs 816 may be a replica of each of the stacked NMOS FETs variable bleed current sources 824+ and 824− of the input current mirror stage 820.

The replica bias circuit 810 is configured to generate a reference current $I_{REF}$ through each of the NMOS FETs M21/M23 and PMOS FETs M22/M24 to generate first and second bias voltages cgb$_n$ and cgb$_p$ for the gates of the input common gate NMOS FETs M27$_+$/M27$_-$ and PMOS FETs M28$_+$/M28$_-$, respectively; and generate third and fourth bias voltages blb$_p$ and blb$_n$ for the gates of stacked PMOS FETs bleed current sources 822$_+$/822$_-$ and stacked NMOS FETs bleed current sources 824$_+$/824$_-$, respectively. The size or effective W/L of the input common gate NMOS FETs M27$_+$/M27$_-$ and PMOS FETs M28$_+$/M28$_-$ of the input current mirror stage 820 may be N times the size or effective W/L of the NMOS FETs M21/M23 and PMOS FETs M22/M24, so that the DC current flowing through the input NMOS FETs M27$_+$/M27$_-$ and PMOS FETs M28$_+$/M28$_-$ of the input current mirror stage 820 is $N*I_{REF}$.

The input current mirror stage 820 includes a positive current path including stacked PMOS FETs M25$_+$ and M26$_+$, the input common gate NMOS FET M27$_+$, the input common gate PMOS FET M28$_+$, and the stacked NMOS FETs M29$_+$ and M30$_+$, all coupled in series between the upper voltage rail Vdd and the lower voltage rail Vss. In more detail, the stacked PMOS FET M25$_+$ includes a source coupled to the upper voltage rail Vdd, a gate coupled to gate and drain of stacked PMOS FET M26$_+$, and a drain coupled to a source of stacked PMOS FET M26$_+$. The NMOS FET M27$_+$ includes a drain coupled to the gate/drain of the stacked PMOS FET M26$_+$, and a gate configured to receive the first bias voltage cgb$_n$ generated by the replica bias circuit 810. The PMOS FET M28$_+$ includes a source coupled to a source of the NMOS FET M27$_+$, and a gate configured to receive the second bias voltage cgb$_p$ generated by the replica bias circuit 810. The stacked NMOS FET M29$_+$ includes gate and drain coupled together, to the gate of stacked NMOS FET M30$_+$, and to the drain of PMOS FET M28$_+$, and a source coupled to a drain of stacked NMOS FET M30$_+$. The stacked NMOS FET M30$_+$ includes a source coupled to the lower voltage rail Vss.

The positive current path also includes the stacked PMOS FETs variable bleed current source 822$_+$ coupled between the upper voltage rail Vdd and the gate/drain of stacked PMOS FET M26$_+$ (e.g., in parallel with the stacked PMOS FETs M25$_+$ and M26$_+$) and the stacked NMOS FETs variable bleed current source 824, coupled between the gate/drain of PMOS FET M29$_+$ and the lower voltage rail Vss (e.g., in parallel with the stacked NMOS FETs M29$_+$ and M30$_+$). The stacked PMOS FETs variable bleed current source 822$_+$ includes gates configured to receive the third bias voltage blb$_p$ generated by the replica bias circuit 810. The stacked NMOS FETs variable bleed current source 824$_+$ includes gates configured to receive the fourth bias voltage bib, generated by the replica bias circuit 810.

The input current mirror stage 820 further includes a negative current path including the stacked PMOS FETs M25$_-$ and M26$_-$, the input common gate NMOS FET M27$_-$, the input common gate PMOS FET M28_, and the stacked NMOS FETs M29_ and M30_, all coupled in series between the upper voltage rail Vdd and the lower voltage rail Vss. In more detail, the stacked PMOS FET M25_ includes a source coupled to the upper voltage rail Vdd, and a gate coupled to gate and drain of stacked PMOS FET M26_. The NMOS FET M27_ includes a drain coupled to the gate/drain of the stacked PMOS FET M26_, and a gate configured to receive the first bias voltage $cgb_n$. The PMOS FET M28_ includes a source coupled to a source of NMOS FET M27_, and a gate configured to receive the second bias voltage $cgb_p$. The stacked NMOS FET M29_ includes a drain coupled to its gate, to the gate of stacked NMOS FET M30_, and to the drain of PMOS FET M28_. The stacked NMOS FET M29_ includes a source coupled to a drain of stacked NMOS FET M30_. The stacked NMOS FET M30_ includes a source coupled to the lower voltage rail Vss.

The negative current path also includes the stacked PMOS FETs variable bleed current source 822_ coupled between the upper voltage rail Vdd and the gate/drain of stacked PMOS FET M26_ (e.g., in parallel with the stacked PMOS FETs M25_ and M26_); and the stacked NMOS FETs variable bleed current source 824_ coupled between the gate/drain of PMOS FET M29_+ and the lower voltage rail Vss (e.g., in parallel with the stacked NMOS FETs M29_ and M30_). The stacked PMOS FETs variable bleed current source 822_ includes gates configured to receive the third bias voltage $blb_p$ generated by the replica bias circuit 810. The stacked NMOS FETs variable bleed current source 824_ includes gates configured to receive the fourth bias voltage $blb_n$ generated by the replica bias circuit 810.

The output current mirror stage 830 includes a positive current path including stacked PMOS FETs 832_+ coupled in series with stacked NMOS FETs 834_+ between the upper voltage rail Vdd and the lower voltage rail Vss. The gates of the stacked PMOS FETs 832_+ is coupled to the gate/drain of PMOS FET M26_. The gates of the stacked NMOS FET 834_+ is coupled to the gate/drain of NMOS FET M29_. The output current mirror stage 830 further includes a negative current path including stacked PMOS FETs 832_ coupled in series with stacked NMOS FETs 834_ between the upper voltage rail Vdd and the lower voltage rail Vss. The gate of the stacked PMOS FETs 832_ is coupled to the gate/drain of PMOS FET M16_+. The gate of the stacked NMOS FET 834_ is coupled to the gate/drain of NMOS FET M29_+.

The sources of the NMOS FET M27_+ and PMOS FET M28_+ serve as a positive input (In+) for an input differential current signal. The sources of the NMOS FET M27_ and PMOS FET M28_ serve as a negative input (In−) for the input differential current signal. The drains of the bottom stacked PMOS FET 832_+ and top stacked NMOS FET 834_+ serve as a positive output (Out+) for an output differential current signal. The drains of the bottom stacked PMOS FET 832_ and the top stacked NMOS FET 834_ serve as a negative output (Out−) for the output differential current signal. A load $R_L$ (e.g., an input of an ADC) is coupled between the positive output (Out+) and the negative output (Out−) of the current buffer 800.

The size or W/L of the stacked PMOS FETs 832_+/832_ and stacked NMOS FETs 834_+/834_ of the output current mirror stage 830 may be M times the size or W/L of the stacked PMOS FETs M25_+-M26_+/M25_-M26_ and stacked NMOS FETs M29_+-M30_+/M29_-M30_ of the input current mirror stage 820 to achieve a current gain of M between the output differential current signal and the input differential current signal, where M is variable or programmable. The variable M may be set to produce a particular voltage swing range at the input of the ADC load $R_L$ in order to achieve a certain SNR in the conversion of the output differential signal into a digital signal. If the maximum voltage swing at the ADC load $R_L$ is maintained constant to achieve the desired SNR, and the current gain M is increased, then the DC current through the stacked PMOS FETs M25_+-M26_+/M25_-M26_ and stacked NMOS FETs M29_+-M30_+/M29_-M30_ of the input current mirror stage 820 decreases. If the bleed current sources 822_+/822_ and 824_+/824_ are not present, the decreased current would flow through the input transistors M27_+/M27_ and M28_+/M28_, which would increase the input impedance of the current buffer 800.

Thus, as the current gain M is changed to achieve a certain voltage swing across the load $R_L$ and/or a certain linearity for the current buffer 800, the bleed current sources 822_+/822_ and 824_+/824_ are programmed to generate a current such that the current through the input transistors M27_+/M27_ and M28_+/M28_ is maintained substantially constant to achieve a substantially constant low input impedance (e.g., around 20Ω), as previously discussed. As discussed further herein, the stacked PMOS FETs and NMOS FETs of the input current mirror stage 820, and the stacked PMOS FETs and NMOS FETs of the output current mirror stage 830 may improve the linearity and noise characteristics of the current buffer 800.

The reconfigurable bandwidth circuit 840 includes a set of variable capacitors $C_{1+}$, $C_{2+}$, $C_{1−}$, and $C_{2−}$, and a switching network 842. The capacitors $C_{1+}$ and $C_{2+}$ include respective first terminals coupled to the positive output (Out+) of the current buffer 800, and respective second terminals coupled to the switching network 842. Similarly, the capacitors $C_{1−}$ and $C_{2−}$ include respective first terminals coupled to the negative output (Out−) of the current buffer 800, and respective second terminals coupled to the switching network 842.

The switching network 842 is configured to receive a mode signal indicating whether a bandwidth mode is low or high. As discussed in more detail below, if the mode signal indicates a low BW mode, the second terminals of the capacitors $C_{1+}$, $C_{2+}$, $C_{1+}$, and $C_{2−}$ are coupled to negative (In−) and positive (In+) inputs of the input current mirror stage 820 to configure the capacitors as Miller capacitors, respectively. If the mode signal indicates a high BW mode, the second terminals of the capacitors $C_{1+}$, $C_{2+}$, $C_{1−}$, and $C_{2−}$ are coupled to positive nodes pd_+ and nd_+ and negative nodes pd_ and nd_ of the input current mirror stage 820 to configure the capacitors as Cgd neutralization capacitors, respectively.

More specifically, if the mode signal indicates low BW mode, the switching network 842 couples the second terminals of capacitors $C_{1+}$ and $C_{2+}$ to the negative input (In−) of the current buffer 800, and couples the second terminals of capacitors $C_{1−}$ and $C_{2−}$ to the positive input (In+) of the current buffer 800. As the voltages generated at the positive and negative outputs (Out+) and (Out−) vary oppositely to the voltages generated at the negative and positive inputs (In−) and (In+), respectively, the effective capacitances of the capacitors $C_{1+}$, $C_{2+}$, $C_{1−}$, and $C_{2−}$ is the native capacitance of these capacitors multiplied by one plus the voltage gain $A_v$. This produces a relatively high capacitance to position a pole of an LPF frequency response of the current buffer 800 within a first frequency range (e.g., 100 MHz to 600 MHz).

If the mode signal indicates high BW mode, the switching network 842 couples the second terminals of capacitors $C_{1+}$ and $C_{2+}$ to the positive PMOS and NMOS outputs (pd+) and (nd+) of the input current mirror stage 820, and couples the second terminals of capacitors $C_{1−}$ and $C_{2−}$ to the negative PMOS and NMOS outputs (pd–) and (nd–) of the input current mirror stage 820. As the voltages generated at the positive and negative outputs (Out+) and (Out–) vary in the same direction as the voltages at the positive PMOS and NMOS outputs (pd+) and (nd+) and negative PMOS and NMOS outputs (pd–) and (nd–), the gate-drain capacitances of the positive stacked PMOS FETs and NMOS FETs 832_/834_ and negative stacked PMOS FETs and NMOS FETs 832_+/834_+ are neutralized, respectively. This produces a relatively low capacitance to position a pole of an LPF frequency response of the current buffer 800 within a second frequency range (e.g., 600 MHz to 800 MHz) higher than the first frequency range.

The output common voltage control circuit 850 includes an operational amplifier 852, a common mode feedback (CMFB) circuit 854, and a pair of resistors $R_{cm+}$ and $R_{cm-}$. The operational amplifier 852, which is configured as a voltage-follower or buffer, includes a positive input configured to receive a target output common mode voltage Vcm_out for setting/controlling a common mode voltage at the output of the current buffer 800. The operational amplifier 852 includes a negative input coupled to its output, and to an input of the CMFB circuit 854. The CMFB circuit 854 further includes inputs coupled to the positive and negative outputs (Out+) and (Out–) of the current buffer 800 to measure the current common mode voltage. The resistors $R_{cm+}$ and $R_{cm-}$ are coupled in series between the positive and negative outputs (Out+) and (Out–) of the current buffer 800. The CMFB circuit 854 includes an output coupled to a node between the resistors $R_{cm+}$ and $R_{cm-}$.

In operation, if the CMFB circuit 854 determines that the current common mode voltage at the positive and negative outputs (Out+) and (Out–) of the current buffer 800 is lower than the target common mode voltage Vcm_out, the CMFB circuit 854 increases the voltage at the node between the resistors $R_{cm+}$ and $R_{cm-}$ to increase the current common mode voltage such that it is substantially the same as the target common mode voltage Vcm_out. Similarly, if the CMFB circuit 854 determines that the current common mode voltage at the positive and negative outputs (Out+) and (Out–) of the current buffer 800 is higher than the target common mode voltage Vcm_out, the CMFB circuit 854 decreases the voltage at the node between the resistors $R_{cm+}$ and $R_{cm-}$ to decrease the current common mode voltage such that it is substantially the same as the target common mode voltage Vcm_out.

The following provides an overview of aspects of the present disclosure:

Aspect 1: An apparatus, comprising: a positive input for an input differential signal; a negative input for the input differential signal; a positive output for an output differential signal; a negative output for the output differential signal; a first capacitor including a first terminal coupled to the positive output; a second capacitor including a first terminal coupled to the negative output; and a switching network configured to: couple a second terminal of the first capacitor to the negative input or a positive node based on a mode signal; and couple a second terminal of the second capacitor to the positive input or a negative node based on the mode signal.

Aspect 2: The apparatus of aspect 1, wherein the positive node coincides with the positive input, and the negative node coincides with the negative input.

Aspect 3: The apparatus of aspect 1 or 2, wherein the switching network is configured to couple the second terminal of the first capacitor to the negative input, and the second terminal of the second capacitor to the positive input in response to the mode signal indicating a low bandwidth mode.

Aspect 4: The apparatus of any one of aspects 1-3, wherein the switching network is configured to couple the second terminal of the first capacitor to the positive node, and the second terminal of the second capacitor to the negative node in response to the mode signal indicating a high bandwidth mode.

Aspect 5: The apparatus of any one of aspects 1-4, further comprising: a first field effect transistor (FET) including a first gate and a first drain, wherein the first gate coincides with the positive input, and wherein the first drain coincides with the negative output or the negative node; and a second FET including a second gate and a second drain, wherein the second gate coincides with the negative input, and wherein the second drain coincides with the positive input or the positive node.

Aspect 6: The apparatus of any one of aspects 1-4, further comprising: a first field effect transistor (FET) including a first source, a first gate, and a first drain, wherein the first source is coupled to an upper voltage rail, and wherein the first gate is coupled to the first drain; a first current source coupled between the first drain and a lower voltage rail, wherein the first drain coincides with the positive input or the positive node; a second FET including a second source, a second gate, and a second drain, wherein the second source is coupled to the upper voltage rail, and wherein the second gate is coupled to the second drain; a second current source coupled between the second drain and the lower voltage rail, wherein the second drain coincides with the negative input or the negative node; a third FET including a third source, a third gate, and a third drain, wherein the third source is coupled to the upper voltage rail, wherein the third gate is coupled to the second gate, and wherein the third drain serves as the positive output; and a fourth FET including a fourth source, a fourth gate, and a fourth drain, wherein the fourth source is coupled to the upper voltage rail, wherein the fourth gate is coupled to the first gate, and wherein the fourth drain serves as the negative output.

Aspect 7: The apparatus of aspect 6, further comprising: a first load coupled between the positive output and the lower voltage rail; and a second load coupled between the negative output and the lower voltage rail.

Aspect 8: The apparatus of any one of aspects 1-4, further comprising: a first current source; a first field effect transistor (FET) including a first source, a first gate, and a first drain, wherein the first current source is coupled between an upper voltage rail and the first drain, wherein the first drain is coupled to the first gate, wherein the first source is coupled to a lower voltage rail, and wherein the first drain serves as the positive input or the positive node; a second current source; a second FET including a second source, a second gate, and a second drain, wherein the second current source is coupled between the upper voltage rail and the second drain, wherein the second drain is coupled to the second gate, wherein the second source is coupled to the lower voltage rail, and wherein the second drain serves as the negative input or the negative node; a third FET including a third source, a third gate, and a third drain, wherein the third drain serves as the positive output, wherein the third gate is coupled to the second gate, and wherein the third source is coupled to the lower voltage rail; and a fourth FET including a fourth source, a fourth gate, and a fourth drain, wherein the fourth drain serves as the negative output, wherein the fourth gate is coupled to the first gate, and wherein the fourth source is coupled to the lower voltage rail.

Aspect 9: The apparatus of aspect 8, further comprising: a first load coupled between the upper voltage rail and the positive output; and a second load coupled between the upper voltage rail and the negative output.

Aspect 10: The apparatus of claim 1, wherein the positive node comprises a first positive node and a second positive node, wherein the negative node comprises a first negative node and a second negative node, wherein the first capacitor comprises a first set of capacitors including a first set of terminals coupled to the positive output, wherein the second capacitor comprises a second set of capacitors including a first set of terminals coupled to the negative output, and wherein the switching network is configured to: couple a second set of terminals of the first set of capacitors to the negative input or the first and second positive nodes, respectively, based on the mode signal; and couple a second set of terminals of the second set of capacitors to the positive input or the first and second negative nodes, respectively, based on the mode signal.

Aspect 11: The apparatus of claim 10, further comprising: a first p-channel metal oxide semiconductor field effect transistor (PMOS FET) including a first PMOS source, a first PMOS gate, and a first PMOS drain, wherein the first PMOS gate is coupled to the first PMOS drain, and wherein the first PMOS drain serves as the first positive node; a first n-channel metal oxide semiconductor field effect transistor (NMOS FET) including a first NMOS drain, a first NMOS gate, and a first NMOS source, wherein the first NMOS drain is coupled to the first PMOS drain, wherein the first NMOS gate is configured to receive a first bias voltage, and wherein the first NMOS source serves as the positive input: a second PMOS FET including a second PMOS source, a second PMOS gate, and a second PMOS drain, wherein the second PMOS source is coupled to the first NMOS source, wherein the second PMOS gate is configured to receive a second bias voltage, and wherein the second PMOS drain serves as the second positive node; and a second NMOS FET including a second NMOS drain, a second NMOS gate, and a second NMOS source, wherein the second NMOS drain is coupled to the second PMOS drain, and wherein the second NMOS gate is coupled to the second NMOS gate.

Aspect 12: The apparatus of claim 11, further comprising: a third PMOS FET including a third PMOS source, a third PMOS gate, and a third PMOS drain, wherein the third PMOS gate is coupled to the third PMOS drain, and wherein the third PMOS drain serves as the first negative node; a third NMOS FET including a third NMOS drain, a third NMOS gate, and a third NMOS source, wherein the third NMOS drain is coupled to the third PMOS drain, wherein the third NMOS gate is configured to receive the first bias voltage, and wherein the third NMOS source serves as the negative input; a fourth PMOS FET including a fourth PMOS source, a fourth PMOS gate, and a fourth PMOS drain, wherein the fourth PMOS source is coupled to the third NMOS source, wherein the fourth PMOS gate is configured to receive the second bias voltage, and wherein the fourth PMOS drain serves as the second negative node; and a fourth NMOS FET including a fourth NMOS drain, a fourth NMOS gate, and a fourth NMOS source, wherein the fourth NMOS drain is coupled to the fourth PMOS drain, and wherein the fourth NMOS gate is coupled to the fourth NMOS gate.

Aspect 13: The apparatus of aspect 12, further comprising: a fifth PMOS FET including a fifth PMOS source, a fifth PMOS gate, and a fifth PMOS drain, wherein the fifth PMOS source is coupled to an upper voltage rail, wherein the fifth PMOS gate is coupled to the first PMOS gate, and wherein the fifth PMOS drain is coupled to the first PMOS source; a sixth PMOS FET including a sixth PMOS source, a sixth PMOS gate, and a sixth PMOS drain, wherein the sixth PMOS source is coupled to the upper voltage rail, wherein the sixth PMOS gate is coupled to the third PMOS gate, and wherein the sixth PMOS drain is coupled to the third PMOS source; a fifth NMOS FET including a fifth NMOS drain, a fifth NMOS gate, and a fifth NMOS source, wherein the fifth NMOS drain is coupled to the second NMOS source wherein the fifth NMOS gate is coupled to the second NMOS gate, and wherein the fifth NMOS source is coupled to a lower voltage rail; and a sixth NMOS FET including a sixth NMOS drain, a sixth NMOS gate, and a sixth NMOS source, wherein the sixth NMOS drain is coupled to the fourth NMOS source wherein the sixth NMOS gate is coupled to the fourth NMOS gate, and wherein the sixth NMOS source is coupled to the lower voltage rail.

Aspect 14: The apparatus of claim 12, further comprising: a fifth PMOS FET including a fifth PMOS source, a fifth PMOS gate, and a fifth PMOS drain, wherein the fifth PMOS gate is coupled to the first negative node, and wherein the fifth PMOS drain serves as the positive output; a fifth NMOS FET including a fifth NMOS source, a fifth NMOS gate, and a fifth NMOS drain, wherein the fifth NMOS gate is coupled to the second positive node, and wherein the fifth NMOS drain is coupled to the fifth PMOS drain; a sixth PMOS FET including a sixth PMOS source, a sixth PMOS gate, and a sixth PMOS drain, wherein the sixth PMOS gate is coupled to the first negative node, and wherein the sixth PMOS drain serves as the positive output; and a sixth NMOS FET including a sixth NMOS source, a sixth NMOS gate, and a sixth NMOS drain, wherein the sixth NMOS gate is coupled to the second negative node, and wherein the sixth NMOS drain is coupled to the sixth PMOS drain.

Aspect 15: The apparatus of claim 14, further comprising: a seventh PMOS FET including a seventh PMOS source, a seventh PMOS gate, and a seventh PMOS drain, wherein the seventh PMOS source is coupled to a upper voltage rail, wherein the seventh PMOS gate is coupled to the fifth PMOS gate, and wherein the seventh PMOS drain is coupled to the fifth PMOS source; an eighth PMOS FET including an eighth PMOS source, an eighth PMOS gate, and an eighth PMOS drain, wherein the eighth PMOS source is coupled to the upper voltage rail, wherein the eighth PMOS gate is coupled to the sixth PMOS gate, and wherein the eighth PMOS drain is coupled to the sixth PMOS source; a seventh NMOS FET including a seventh NMOS drain, a seventh NMOS gate, and a seventh NMOS source, wherein the seventh NMOS drain is coupled to the fifth NMOS source, wherein the seventh NMOS gate is coupled to the fifth NMOS gate, and wherein the seventh NMOS source is coupled to a lower voltage rail; and an eighth NMOS FET including an eighth NMOS drain, an eighth NMOS gate, and an eighth NMOS source, wherein the eighth NMOS drain is coupled to the sixth NMOS source, wherein the eighth NMOS gate is coupled to the sixth NMOS gate, and wherein the eighth NMOS source is coupled to the lower voltage rail.

Aspect 16: The apparatus of any one of aspects 11-15, further comprising a bias circuit configured to generate the first bias voltage and the second bias voltage.

Aspect 17: The apparatus of aspect 16, wherein the bias circuit comprises a first current source, a diode-connected NMOS FET, a diode-connected PMOS FET, and a second current source, all coupled in series between an upper voltage rail and a lower voltage rail; and a voltage-follower configured to receive and apply a target common mode voltage to a node between the diode-connected NMOS FET and the diode-connected PMOS FET, wherein the first bias voltage is generated at a first drain/gate of the diode-connected NMOS FET, and wherein the second bias voltage is generated at a second drain/gate of the diode-connected PMOS FET.

Aspect 18: The apparatus of any one of aspects 12-17, further comprising: a first variable current source coupled between an upper voltage rail and the first PMOS drain of the first PMOS FET; a second variable current source coupled between the upper voltage rail and the third PMOS drain of the third PMOS FET; a third variable current source coupled between the second NMOS drain of the second NMOS FET and a lower voltage rail; and a fourth variable current source coupled between the fourth NMOS drain of the fourth NMOS FET and the lower voltage rail.

Aspect 19: The apparatus of aspect 18, wherein the first and second variable current sources are configured to receive a third bias voltage, and wherein the third and fourth variable current sources are configured to receive a fourth bias voltage.

Aspect 20: The apparatus of aspect 19, further comprising a bias circuit configured to generate the first, second, third, and fourth bias voltages.

Aspect 21: The apparatus of aspect 20, wherein the bias circuit comprises: a first current source, a diode-connected NMOS FET, a diode-connected PMOS FET, and a second current source, all coupled in series between the upper voltage rail and the lower voltage rail; a voltage-follower configured to receive and apply a target common mode voltage to a node between the diode-connected NMOS FET and the diode-connected PMOS FET, wherein the first bias voltage is generated at a first drain/gate of the diode-connected NMOS FET, and wherein the second bias voltage is generated at a second drain/gate of the diode-connected PMOS FET; and a third current source, a fifth NMOS FET, a fifth PMOS FET, and a fourth current source, all coupled in series between the upper voltage rail and the lower voltage rail, wherein a gate of the fifth NMOS FET is coupled to a gate of the diode-connected NMOS FET, wherein a gate of the fifth PMOS FET is coupled to a gate of the diode-connected NMOS FET, and wherein the third and fourth current sources are configured to generate the third and fourth bias voltages.

Aspect 22: A method, comprising coupling capacitors to a differential amplifier to configure the capacitors as Miller capacitors or gate-drain neutralization capacitors based on a mode signal.

Aspect 23: The method of aspect 22, wherein coupling the capacitors comprises coupling the capacitors to the differential amplifier to configure the capacitors as Miller capacitors in response to the mode signal indicating a low bandwidth mode, and coupling the capacitors to the differential amplifier to configure the capacitors as gate-drain neutralization capacitors in response to the mode signal indicating a high bandwidth mode.

Aspect 24: An apparatus, comprising: an input current mirror field effect transistor (FET); an input FET coupled in series with the input current mirror FET, wherein the input FET includes a gate configured to receive an input signal: a variable current source coupled in parallel with the input current mirror FET; an output current mirror FET including a gate coupled to a gate/drain of the input current mirror FET; and a control circuit configured to control an impedance at the gate of the input FET including adjusting a first current through the first input current mirror FET and a second current generated by the first variable current source to control a third current through the input FET.

Aspect 25: The apparatus of aspect 24, wherein the control circuit is configured to adjust the first and second currents such that the third current is substantially constant.

Aspect 26: The apparatus of aspect 24 or 25, further comprising: a second input FET including a source coupled to the source of the first input FET; a second input current mirror FET coupled in series with the second input FET; a second variable current source coupled in parallel with the second input current mirror FET; and a second output current mirror FET including a gate coupled to a gate/drain of the second input current mirror FET, wherein the control circuit is configured to control the impedance at the sources of the first and second input FETs including adjusting the first current through the first and second input current mirror FETs and the second current generated by the first and second variable current sources to control the third current through the first and second input FETs.

Aspect 27: The apparatus of any one of aspects 24-26, further comprising: a second input FET including a gate coupled to a gate of the first input FET, wherein the second input FET includes a source configured to receive the input signal; a second input current mirror FET coupled in series with the second input FET; a second variable current source coupled in parallel with the second input current mirror FET; and a second output current mirror FET including a gate coupled to a gate/drain of the second input current mirror FET, wherein the control circuit configured to control the impedance at the sources of the first and second input FETs including adjusting a fourth current through the second input current mirror FET and a fifth current generated by the second variable current source to control a sixth current through the second input FET.

Aspect 28: The apparatus of aspect 24, further comprising: a second input FET including a source coupled to the source of the first input FET; a second input current mirror FET coupled in series with the second input FET; a second variable current source coupled in parallel with the second input current mirror FET; a second output current mirror FET including a gate coupled to a gate/drain of the second input current mirror FET; a third input FET including a gate coupled to a gate of the first input FET, wherein the third input FET includes a source configured to receive the input signal; a third input current mirror FET coupled in series with the third input FET; a third variable current source coupled in parallel with the third input current mirror FET; a third output current mirror FET including a gate coupled to a gate/drain of the third input current mirror FET; a fourth input FET including a source coupled to the source of the third input FET; a fourth input current mirror FET coupled in series with the fourth input FET; a fourth variable current source coupled in parallel with the fourth input current mirror FET; a fourth output current mirror FET including a gate coupled to a gate/drain of the fourth input current mirror FET; wherein the control circuit is configured to control the impedance at the sources of the first, second, third, and fourth input FETs including adjusting currents through the second, third, and fourth input current mirror FETs and generated by the second, third, and fourth variable current sources.

Aspect 29: A method, including generating a first current through an input current mirror field effect transistor (FET); generating a second current through an output current mirror FET related to a current gain multiplied by the first current;

generating a third current; and generating a fourth current through an input FET being related to a sum of the first and third currents.

Aspect 30: The method of aspect 29, further comprising adjusting the first and third current to control an input impedance at a source of the input FET, wherein the source of the input FET is configured to receive an input signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a positive input for an input differential signal;
   a negative input for the input differential signal;
   a positive output for an output differential signal;
   a negative output for the output differential signal;
   a first capacitor including a first terminal coupled to the positive output;
   a second capacitor including a first terminal coupled to the negative output; and
   a switching network configured to:
      couple a second terminal of the first capacitor to the negative input or a positive node based on a mode signal; and
      couple a second terminal of the second capacitor to the positive input or a negative node based on the mode signal;
   wherein the switching network is configured to couple the second terminal of the first capacitor to the positive node, and the second terminal of the second capacitor to the negative node in response to the mode signal indicating a high bandwidth mode.

2. The apparatus of claim 1, wherein the positive node coincides with the positive input, and the negative node coincides with the negative input.

3. The apparatus of claim 1, wherein the switching network is configured to couple the second terminal of the first capacitor to the negative input, and the second terminal of the second capacitor to the positive input in response to the mode signal indicating a low bandwidth mode.

4. The apparatus of claim 1, further comprising:
   a first field effect transistor (FET) including a first gate and a first drain, wherein the first gate coincides with the positive input, and wherein the first drain coincides with the negative output or the negative node; and
   a second FET including a second gate and a second drain, wherein the second gate coincides with the negative input, and wherein the second drain coincides with the positive output or the positive node.

5. An apparatus, comprising:
   a positive input for an input differential signal;
   a negative input for the input differential signal;
   a positive output for an output differential signal;
   a negative output for the output differential signal;
   a first capacitor including a first terminal coupled to the positive output;
   a second capacitor including a first terminal coupled to the negative output;

a switching network configured to:
   couple a second terminal of the first capacitor to the negative input or a positive node based on a mode signal; and
   couple a second terminal of the second capacitor to the positive input or a negative node based on the mode signal;
a first field effect transistor (FET) including a first source, a first gate, and a first drain, wherein the first source is coupled to an upper voltage rail, and wherein the first gate is coupled to the first drain;
a first current source coupled between the first drain and a lower voltage rail, wherein the first drain coincides with the positive input or the positive node;
a second FET including a second source, a second gate, and a second drain, wherein the second source is coupled to the upper voltage rail, and wherein the second gate is coupled to the second drain;
a second current source coupled between the second drain and the lower voltage rail, wherein the second drain coincides with the negative input or the negative node;
a third FET including a third source, a third gate, and a third drain, wherein the third source is coupled to the upper voltage rail, wherein the third gate is coupled to the second gate, and wherein the third drain serves as the positive output; and
a fourth FET including a fourth source, a fourth gate, and a fourth drain, wherein the fourth source is coupled to the upper voltage rail, wherein the fourth gate is coupled to the first gate, and wherein the fourth drain serves as the negative output.

6. The apparatus of claim 5, further comprising:
   a first load coupled between the positive output and the lower voltage rail; and
   a second load coupled between the negative output and the lower voltage rail.

7. An apparatus, comprising:
   a positive input for an input differential signal;
   a negative input for the input differential signal;
   a positive output for an output differential signal;
   a negative output for the output differential signal;
   a first capacitor including a first terminal coupled to the positive output;
   a second capacitor including a first terminal coupled to the negative output;
   a switching network configured to:
      couple a second terminal of the first capacitor to the negative input or a positive node based on a mode signal; and
      couple a second terminal of the second capacitor to the positive input or a negative node based on the mode signal;
   a first current source;
   a first field effect transistor (FET) including a first source, a first gate, and a first drain, wherein the first current source is coupled between an upper voltage rail and the first drain, wherein the first drain is coupled to the first gate, wherein the first source is coupled to a lower voltage rail, and wherein the first drain serves as the positive input or the positive node;
   a second current source;
   a second FET including a second source, a second gate, and a second drain, wherein the second current source is coupled between the upper voltage rail and the second drain, wherein the second drain is coupled to the second gate, wherein the second source is coupled to the lower voltage rail, and wherein the second drain serves as the negative input or the negative node;

a third FET including a third source, a third gate, and a third drain, wherein the third drain serves as the positive output, wherein the third gate is coupled to the second gate, and wherein the third source is coupled to the lower voltage rail; and a fourth FET including a fourth source, a fourth gate, and a fourth drain, wherein the fourth drain serves as the negative output, wherein the fourth gate is coupled to the first gate, and wherein the fourth source is coupled to the lower voltage rail.

8. The apparatus of claim 7, further comprising:

a first load coupled between the upper voltage rail and the positive output; and a second load coupled between the upper voltage rail and the negative output.

9. An apparatus, comprising:

a positive input for an input differential signal;

a negative input for the input differential signal;

a positive output for an output differential signal;

a negative output for the output differential signal;

a first capacitor including a first terminal coupled to the positive output;

a second capacitor including a first terminal coupled to the negative output;

a switching network configured to:

couple a second terminal of the first capacitor to the negative input or a positive node based on a mode signal; and couple a second terminal of the second capacitor to the positive input or a negative node based on the mode signal;

wherein the positive node comprises a first positive node and a second positive node, wherein the negative node comprises a first negative node and a second negative node, wherein the first capacitor comprises a first set of capacitors including a first set of terminals coupled to the positive output, wherein the second capacitor comprises a second set of capacitors including a first set of terminals coupled to the negative output, and wherein the switching network is configured to:

couple a second set of terminals of the first set of capacitors to the negative input or the first and second positive nodes, respectively, based on the mode signal; and couple a second set of terminals of the second set of capacitors to the positive input or the first and second negative nodes, respectively, based on the mode signal.

10. The apparatus of claim 9, further comprising:

a first p-channel metal oxide semiconductor field effect transistor (PMOS FET) including a first PMOS source, a first PMOS gate, and a first PMOS drain, wherein the first PMOS gate is coupled to the first PMOS drain, and wherein the first PMOS drain serves as the first positive node;

a first n-channel metal oxide semiconductor field effect transistor (NMOS FET) including a first NMOS drain, a first NMOS gate, and a first NMOS source, wherein the first NMOS drain is coupled to the first PMOS drain, wherein the first NMOS gate is configured to receive a first bias voltage, and wherein the first NMOS source serves as the positive input;

a second PMOS FET including a second PMOS source, a second PMOS gate, and a second PMOS drain, wherein the second PMOS source is coupled to the first NMOS source, wherein the second PMOS gate is configured to receive a second bias voltage, and wherein the second PMOS drain serves as the second positive node; and a second NMOS FET including a second NMOS drain, a second NMOS gate, and a second NMOS source, wherein the second NMOS drain is coupled to the second PMOS drain, and wherein the second NMOS drain is coupled to the second NMOS gate.

11. The apparatus of claim 10, further comprising:

a third PMOS FET including a third PMOS source, a third PMOS gate, and a third PMOS drain, wherein the third PMOS gate is coupled to the third PMOS drain, and wherein the third PMOS drain serves as the first negative node;

a third NMOS FET including a third NMOS drain, a third NMOS gate, and a third NMOS source, wherein the third NMOS drain is coupled to the third PMOS drain, wherein the third NMOS gate is configured to receive the first bias voltage, and wherein the third NMOS source serves as the negative input;

a fourth PMOS FET including a fourth PMOS source, a fourth PMOS gate, and a fourth PMOS drain, wherein the fourth PMOS source is coupled to the third NMOS source, wherein the fourth PMOS gate is configured to receive the second bias voltage, and wherein the fourth PMOS drain serves as the second negative node; and a fourth NMOS FET including a fourth NMOS drain, a fourth NMOS gate, and a fourth NMOS source, wherein the fourth NMOS drain is coupled to the fourth PMOS drain, and wherein the fourth NMOS drain is coupled to the fourth NMOS gate.

12. The apparatus of claim 11, further comprising:

a fifth PMOS FET including a fifth PMOS source, a fifth PMOS gate, and a fifth PMOS drain, wherein the fifth PMOS source is coupled to an upper voltage rail, wherein the fifth PMOS gate is coupled to the first PMOS gate, and wherein the fifth PMOS drain is coupled to the first PMOS source;

a sixth PMOS FET including a sixth PMOS source, a sixth PMOS gate, and a sixth PMOS drain, wherein the sixth PMOS source is coupled to the upper voltage rail, wherein the sixth PMOS gate is coupled to the third PMOS gate, and wherein the sixth PMOS drain is coupled to the third PMOS source;

a fifth NMOS FET including a fifth NMOS drain, a fifth NMOS gate, and a fifth NMOS source, wherein the fifth NMOS drain is coupled to the second NMOS source, wherein the fifth NMOS gate is coupled to the second NMOS gate, and wherein the fifth NMOS source is coupled to a lower voltage rail; and a sixth NMOS FET including a sixth NMOS drain, a sixth NMOS gate, and a sixth NMOS source, wherein the sixth NMOS drain is coupled to the fourth NMOS source, wherein the sixth NMOS gate is coupled to the fourth NMOS gate, and wherein the sixth NMOS source is coupled to the lower voltage rail.

13. The apparatus of claim 11, further comprising:

a fifth PMOS FET including a fifth PMOS source, a fifth PMOS gate, and a fifth PMOS drain, wherein the fifth PMOS gate is coupled to the first positive node, and wherein the fifth PMOS drain serves as the negative output;

a fifth NMOS FET including a fifth NMOS source, a fifth NMOS gate, and a fifth NMOS drain, wherein the fifth NMOS gate is coupled to the second positive node, and wherein the fifth NMOS drain is coupled to the fifth PMOS drain;

a sixth PMOS FET including a sixth PMOS source, a sixth PMOS gate, and a sixth PMOS drain, wherein the sixth PMOS gate is coupled to the first negative node, and wherein the sixth PMOS drain serves as the positive output; and a sixth NMOS FET including a sixth NMOS source, a sixth NMOS gate, and a sixth NMOS drain, wherein the sixth NMOS gate is coupled to the second negative node, and wherein the sixth NMOS drain is coupled to the sixth PMOS drain.

14. The apparatus of claim 13, further comprising:

a seventh PMOS FET including a seventh PMOS source, a seventh PMOS gate, and a seventh PMOS drain, wherein the seventh PMOS source is coupled to an upper voltage rail, wherein the seventh PMOS gate is coupled to the fifth PMOS gate, and wherein the seventh PMOS drain is coupled to the fifth PMOS source;

an eighth PMOS FET including an eighth PMOS source, an eighth PMOS gate, and an eighth PMOS drain, wherein the eighth PMOS source is coupled to the upper voltage rail, wherein the eighth PMOS gate is coupled to the sixth PMOS gate, and wherein the eighth PMOS drain is coupled to the sixth PMOS source;

a seventh NMOS FET including a seventh NMOS drain, a seventh NMOS gate, and a seventh NMOS source, wherein the seventh NMOS drain is coupled to the fifth NMOS source, wherein the seventh NMOS gate is coupled to the fifth NMOS gate, and wherein the seventh NMOS source is coupled to a lower voltage rail; and an eighth NMOS FET including an eighth NMOS drain, an eighth NMOS gate, and an eighth NMOS source, wherein the eighth NMOS drain is coupled to the sixth NMOS source, wherein the eighth NMOS gate is coupled to the sixth NMOS gate, and wherein the eighth NMOS source is coupled to the lower voltage rail.

15. The apparatus of claim 11, further comprising a bias circuit configured to generate the first bias voltage and the second bias voltage.

16. The apparatus of claim 15, wherein the bias circuit comprises a first current source, a diode-connected NMOS FET, a diode-connected PMOS FET, and a second current source, all coupled in series between an upper voltage rail and a lower voltage rail; and a voltage-follower configured to receive and apply a target common mode voltage to a node between the diode-connected NMOS FET and the diode-connected PMOS FET, wherein the first bias voltage is generated at a first drain/gate of the diode-connected NMOS FET, and wherein the second bias voltage is generated at a second drain/gate of the diode-connected PMOS FET.

17. The apparatus of claim 11, further comprising:

a first variable current source coupled between an upper voltage rail and the first PMOS drain of the first PMOS FET;

a second variable current source coupled between the upper voltage rail and the third PMOS drain of the third PMOS FET;

a third variable current source coupled between the second NMOS drain of the second NMOS FET and a lower voltage rail; and a fourth variable current source coupled between the fourth NMOS drain of the fourth NMOS FET and the lower voltage rail.

18. The apparatus of claim 17, wherein the first and second variable current sources are configured to receive a third bias voltage, and wherein the third and fourth variable current sources are configured to receive a fourth bias voltage.

19. The apparatus of claim 18, further comprising a bias circuit configured to generate the first, second, third, and fourth bias voltages.

20. The apparatus of claim 19, wherein the bias circuit comprises:

a first current source, a diode-connected NMOS FET, a diode-connected PMOS FET, and a second current source, all coupled in series between the upper voltage rail and the lower voltage rail;

a voltage-follower configured to receive and apply a target common mode voltage to a node between the diode-connected NMOS FET and the diode-connected PMOS FET, wherein the first bias voltage is generated at a first drain/gate of the diode-connected NMOS FET, and wherein the second bias voltage is generated at a second drain/gate of the diode-connected PMOS FET; and a third current source, a fifth NMOS FET, a fifth PMOS FET, and a fourth current source, all coupled in series between the upper voltage rail and the lower voltage rail, wherein a gate of the fifth NMOS FET is coupled to a gate of the diode-connected NMOS FET, wherein a gate of the fifth PMOS FET is coupled to a gate of the diode-connected NMOS FET, and wherein the third and fourth current sources are configured to generate the third and fourth bias voltages.

21. A method, comprising coupling capacitors to a differential amplifier to configure the capacitors as gate-drain neutralization capacitors in response to a mode signal indicating a high bandwidth mode;

wherein the capacitors comprise a first capacitor and a second capacitor, and wherein coupling the capacitors to the differential amplifier to configure the capacitors as gate-drain neutralization capacitors comprises:

coupling a first terminal of the first capacitor to a positive output of the differential amplifier;

coupling a first terminal of the second capacitor to a negative output of the differential amplifier;

coupling a second terminal of the first capacitor to a positive input of the differential amplifier; and coupling a second terminal of the second capacitor to a negative input of the differential amplifier.

22. The method of claim 21, further comprising coupling the capacitors to the differential amplifier to configure the capacitors as Miller capacitors in response to the mode signal indicating a low bandwidth mode.

* * * * *